(12) United States Patent
Ando et al.

(10) Patent No.: US 10,734,190 B2
(45) Date of Patent: Aug. 4, 2020

(54) MULTIPLE ELECTRON BEAM IRRADIATION APPARATUS, MULTIPLE ELECTRON BEAM INSPECTION APPARATUS AND MULTIPLE ELECTRON BEAM IRRADIATION METHOD

(71) Applicants: NuFlare Technology, Inc., Yokohama-shi (JP); NuFlare Technology America, Inc., Sunnyvale, CA (US)

(72) Inventors: Atsushi Ando, Tokyo (JP); Munehiro Ogasawara, Hiratsuka (JP); Riki Ogawa, Kawasaki (JP); John Hartley, Stormville, NY (US)

(73) Assignees: NuFlare Technology, Inc., Yokohama-shi (JP); NuFlare Technology America, Inc., Sunnyvale, CA (US)

( * ) Notice: Subject to any disclaimer, the term of this patent is extended or adjusted under 35 U.S.C. 154(b) by 0 days.

(21) Appl. No.: 16/415,581

(22) Filed: May 17, 2019

(65) Prior Publication Data

US 2019/0355547 A1 Nov. 21, 2019

Related U.S. Application Data

(60) Provisional application No. 62/673,660, filed on May 18, 2018.

(51) Int. Cl.
*H01J 37/153* (2006.01)
*H01J 37/141* (2006.01)
*H01J 37/244* (2006.01)

(52) U.S. Cl.
CPC .......... *H01J 37/153* (2013.01); *H01J 37/141* (2013.01); *H01J 37/244* (2013.01);
(Continued)

(58) Field of Classification Search
CPC ...... H01J 37/153; H01J 37/141; H01J 37/244; H01J 2237/1532; H01J 2237/1534; H01J 2237/1536; H01J 2237/2448
(Continued)

(56) References Cited

U.S. PATENT DOCUMENTS 5,864,142 A    1/1999  Muraki et al.
2009/0218506 A1*  9/2009  Nakasuji ............... H01J 37/05
                                                    250/396 ML
(Continued)

FOREIGN PATENT DOCUMENTS

JP          3927620       3/2007
JP       2014-026634 A    2/2014
(Continued)

OTHER PUBLICATIONS

U.S. Appl. No. 16/381,052, filed Apr. 11, 2019, US-2019-0355546-A1, Atsushi Ando.
(Continued)

*Primary Examiner* — Nicole M Ippolito
(74) *Attorney, Agent, or Firm* — Oblon, McClelland, Maier & Neustadt, L.L.P.

(57) ABSTRACT

A multiple electron beam irradiation apparatus includes an electromagnetic lens configured to refract multiple electron beams incident, an aberration corrector arranged in the magnetic field of the electromagnetic lens and configured to be able to individually apply a bias potential and a deflection potential to each of the multiple electron beams, and an objective lens configured to focus the multiple electron beams, a trajectory of the each of which has been individually corrected by the bias potential and the deflection potential, onto a target object.

10 Claims, 15 Drawing Sheets

(52) U.S. Cl.
CPC ............. *H01J 2237/1532* (2013.01); *H01J 2237/1534* (2013.01); *H01J 2237/1536* (2013.01); *H01J 2237/2448* (2013.01)

(58) Field of Classification Search
USPC .................. 250/306, 307, 309, 310, 311
See application file for complete search history.

(56) References Cited

U.S. PATENT DOCUMENTS

| | | | | |
|---|---|---|---|---|
| 2017/0178862 A1* | 6/2017 | Ogasawara | ......... | H01J 37/045 |
| 2019/0362928 A1* | 11/2019 | Inoue | ................ | H01J 37/153 |

FOREIGN PATENT DOCUMENTS

| | | |
|---|---|---|
| JP | 2014-229481 | 12/2014 |
| JP | 2015-95297 A | 5/2015 |

OTHER PUBLICATIONS

Office Action dated Apr. 1, 2020 in corresponding Taiwanese Patent Application No. 108102832 with English Translation.

* cited by examiner

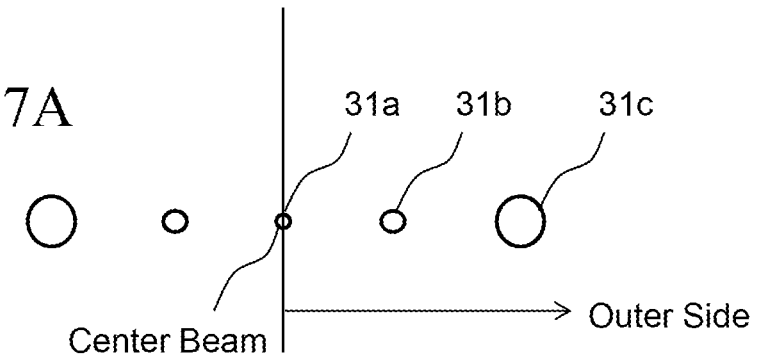
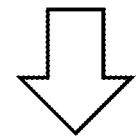
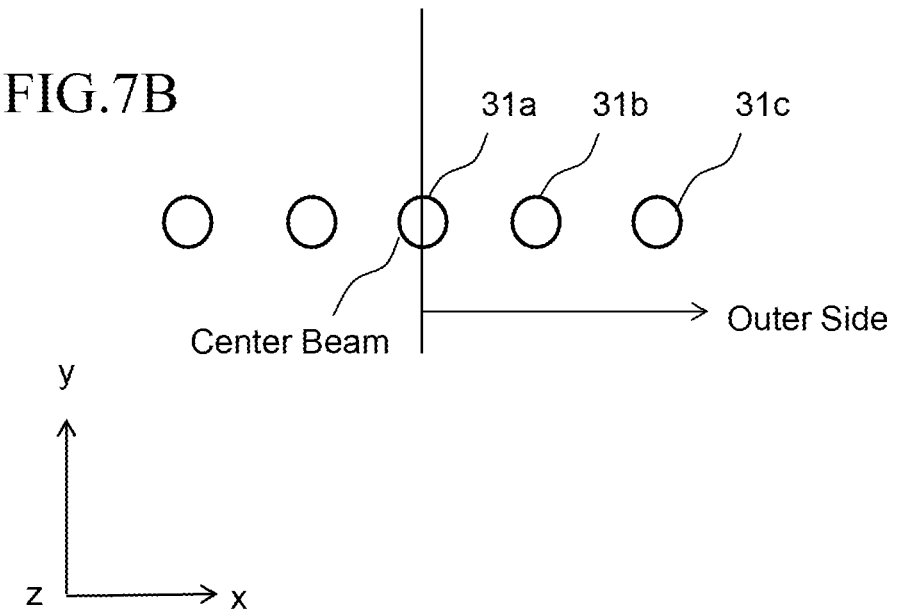

MULTIPLE ELECTRON BEAM IRRADIATION APPARATUS, MULTIPLE ELECTRON BEAM INSPECTION APPARATUS AND MULTIPLE ELECTRON BEAM IRRADIATION METHOD

CROSS-REFERENCE TO RELATED APPLICATION

This application is based upon and claims the benefit of priority from prior Provisional Patent Application No. 62/673,660 filed on May 18, 2018 in U.S.A., the entire contents of which are incorporated herein by reference.

BACKGROUND OF THE INVENTION

Field of the Invention

Embodiments of the present invention relate to a multiple electron beam irradiation apparatus, multiple electron beam inspection apparatus, and multiple electron beam irradiation method. For example, embodiments of the present invention relate to an inspection apparatus for inspecting a pattern by acquiring a secondary electron image of the pattern emitted by irradiation with multiple electron beams.

Description of Related Art

In recent years, with the advance of high integration and large capacity of LSI (Large Scale Integration or Integrated circuits), the line width (critical dimension) required for circuits of semiconductor elements is becoming increasingly narrower. Since LSI manufacturing requires a tremendous amount of manufacturing cost, it is crucial to improve its yield. However, as typified by a 1-gigabit DRAM (Dynamic Random Access Memory), the scale of patterns configuring the LSI has become on the order of nanometers from submicrons. Also, in recent years, with miniaturization of dimensions of LSI patterns formed on a semiconductor wafer, dimension to be detected as a pattern defect is becoming extremely small. Therefore, the pattern inspection apparatus which inspects defects of ultrafine patterns transferred and exposed on the semiconductor wafer needs to be highly accurate. Further, one of major factors that decrease the yield of the LSI manufacturing is due to pattern defects on the mask used for exposing and transferring an ultrafine pattern on a semiconductor wafer by the photolithography technology. Therefore, the pattern inspection apparatus which inspects defects on a transfer mask used in manufacturing LSI needs to be highly accurate.

As an inspection method, there is known a method of comparing a measured image obtained by imaging a pattern formed on the substrate, such as a semiconductor wafer and a lithography mask, with design data or with another measured image obtained by imaging an identical pattern on the substrate. For example, the methods described below are known as pattern inspection, "die-to-die inspection" and "die-to-database inspection": the "die-to-die inspection" method compares data of measured images obtained by imaging identical patterns at different positions on the same substrate; and the "die-to-database inspection" method generates design image data (reference image), based on pattern design data, to be compared with a measured image serving as measured data obtained by imaging a pattern. Then, obtained images are transmitted as measured data to the comparison circuit. After providing alignment between images, the comparison circuit compares the measured data with the reference data in accordance with an appropriate algorithm, and determines that there is a pattern defect if the compared data are not identical.

As the pattern inspection apparatus described above, in addition to the apparatus which irradiates the inspection substrate with laser beams in order to obtain a transmission image or a reflection image of a pattern formed on the substrate, there has been developed an inspection apparatus which acquires a pattern image by scanning the inspection substrate with electron beams and detecting secondary electrons emitted from the inspection substrate along with the irradiation by the electron beams. Further, with respect to the inspection apparatus using electron beams, the apparatus using multiple beams is also developed. As to the multiple beams, if the field of view (FOV) is extended, beam blur increases due to aberration of the optical system. Therefore, there is proposed to deflect a plurality of charged particle beams so as to correct chromatic aberration and spherical aberration by using an aberration corrector composed of a lens array, a quadrupole array, and a deflector array in which are disposed a plurality of deflectors having a function of a concave lens for deflecting a charged particle beam to be away from the optical axis (Japanese Patent Application Laid-open (JP-A) No. 2014-229481). If correction of blur is performed for each beam, the voltage applied to the correction electrode of the aberration corrector becomes large and discharging may occur at the electrode, which causes difficulty in changing potentials at high speed.

BRIEF SUMMARY OF THE INVENTION

According to one aspect of the present invention, a multiple electron beam irradiation apparatus includes an electromagnetic lens configured to refract multiple electron beams incident, an aberration corrector arranged in a magnetic field of the electromagnetic lens and configured to be able to individually apply a bias potential and a deflection potential to each of the multiple electron beams, and an objective lens configured to focus the multiple electron beams, a trajectory of the each of which has been individually corrected by the bias potential and the deflection potential, onto a target object.

According to another aspect of the present invention, a multiple electron beam inspection apparatus includes an electromagnetic lens configured to refract multiple primary electron beams incident, an aberration corrector arranged in a magnetic field of the electromagnetic lens and configured to be able to individually apply a bias potential and a deflection potential to each of the multiple primary electron beams, an objective lens configured to focus the multiple primary electron beams, a trajectory of the each of which has been individually corrected by the bias potential and the deflection potential, onto a target object, and a detector configured to detect multiple secondary electron beams emitted due to irradiation of the multiple primary electron beams onto the target object.

According to yet another aspect of the present invention, a multiple electron beam irradiation method includes receiving multiple electron beams by an electromagnetic lens, and refracting them by it, applying a bias potential and a deflection potential individually to each of the multiple electron beams by an aberration corrector arranged in a magnetic field of the electromagnetic lens, and focusing the multiple electron beams, a trajectory of the each of which has been individually corrected by the bias potential and the deflection potential, onto a target object by an objective lens.

BRIEF DESCRIPTION OF THE DRAWINGS

FIGS. 7A and 7B show examples of the size of an irradiating beam according to the first embodiment;

DETAILED DESCRIPTION OF THE INVENTION

Embodiments below describe an apparatus and method which can reduce, in irradiation with multiple electron beams, aberration or/and distortion by using a potential lower than that used before.

First Embodiment

Figure 1:
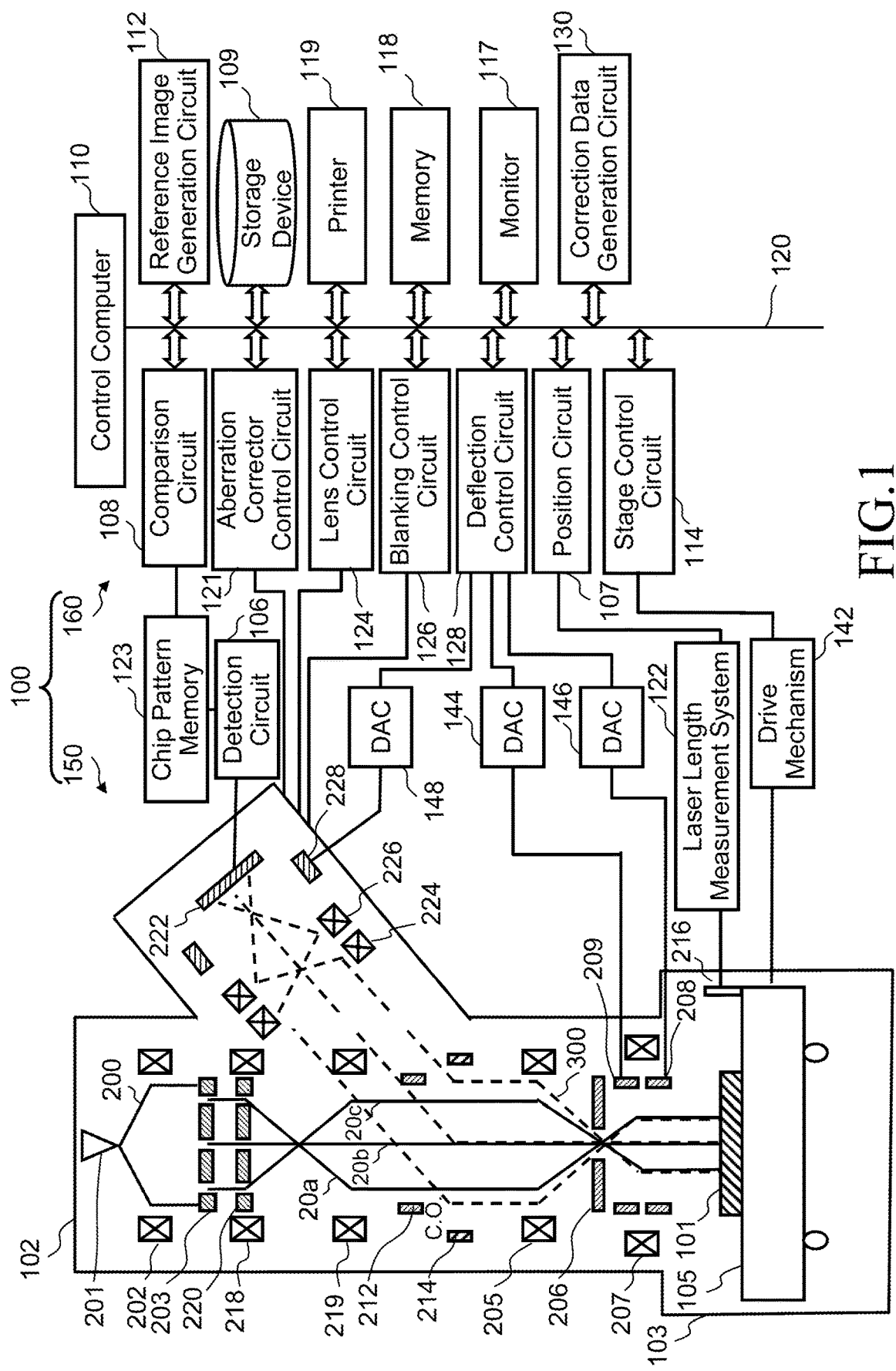
FIG. 1 shows a configuration of a pattern inspection apparatus according to a first embodiment.

FIG. 1 shows a configuration of a pattern inspection apparatus according to a first embodiment. In FIG. 1, an inspection apparatus 100 for inspecting patterns formed on the substrate is an example of an electron beam inspection apparatus. Moreover, the inspection apparatus 100 is an example of a multiple electron beam inspection apparatus. Further, the inspection apparatus 100 is an example of an electron beam irradiation apparatus. Furthermore, the inspection apparatus 100 is an example of a multiple electron beam irradiation apparatus. The inspection apparatus 100 includes an image acquisition mechanism 150 and a control system circuit 160. The image acquisition mechanism 150 includes an electron beam column 102 (also called an electron optical column) (an example of a multi-beam column), an inspection chamber 103, a detection circuit 106, a chip pattern memory 123, a stage drive mechanism 142, and a laser length measuring system 122. In the electron beam column 102, there are disposed an electron gun 201, an illumination lens 202, a shaping aperture array substrate 203, transfer lenses 218 and 219, an aberration corrector 220, a reducing lens 205, a limiting aperture substrate 206, an objective lens 207, a main deflector 208, a sub deflector 209, a common blanking deflector 212, a beam separator 214, projection lenses 224 and 226, a deflector 228, and a multi-detector 222.

In the inspection chamber 103, there is arranged an XY stage 105 movable at least in the x-y plane. On the XY stage 105, there is placed a substrate 101 (target object) to be inspected. The substrate 101 may be an exposure mask substrate, or a semiconductor substrate such as a silicon wafer. When the substrate 101 is a semiconductor substrate, a plurality of chip patterns (wafer die) is formed on the semiconductor substrate. When the substrate 101 is an exposure mask substrate, a chip pattern is formed on the exposure mask substrate. The chip pattern is composed of a plurality of figure patterns. If a chip pattern formed on the exposure mask substrate is exposed (transferred) onto the semiconductor substrate a plurality of times, a plurality of chip patterns (wafer die) is formed on the semiconductor substrate. Hereinafter, the case of the substrate 101 being a semiconductor substrate is mainly described below. The substrate 101 is placed with its pattern forming surface facing upward, on the XY stage 105, for example. Moreover, on the XY stage 105, there is arranged a mirror 216 which reflects a laser beam for measuring a laser length emitted from the laser length measuring system 122 disposed outside the inspection chamber 103. The multi-detector 222 is connected, at the outside of the electron beam column 102, to the detection circuit 106. The detection circuit 106 is connected to the chip pattern memory 123.

In the control system circuit 160, a control computer 110 which controls the whole of the inspection apparatus 100 is connected, through a bus 120, to a position circuit 107, a comparison circuit 108, a reference image generation circuit 112, a stage control circuit 114, an aberration corrector control circuit 121, a lens control circuit 124, a blanking control circuit 126, a deflection control circuit 128, a correction data generation circuit 130, a storage device 109 such as a magnetic disk drive, a monitor 117, a memory 118, and a printer 119. Moreover, the deflection control circuit 128 is connected to DAC (digital-to-analog conversion) amplifiers 144, 146, and 148. The DAC amplifier 146 is connected to the main deflector 208, and the DAC amplifier 144 is connected to the sub deflector 209.

The chip pattern memory 123 is connected to the comparison circuit 108. The XY stage 105 is driven by the drive mechanism 142 under the control of the stage control circuit 114. In the drive mechanism 142, the XY stage 105 can be moved by a drive system, such as a three (x-, y-, and θ-) axis motor, for example, which moves in the directions of x, y, and θ in the stage coordinate system. For example, a step motor can be used as each of these X, Y, and θ motors (not shown). The XY stage 105 is movable in the horizontal direction and the rotation direction by the motors of the X-axis, Y-axis, and θ-axis. The movement position of the XY stage 105 is measured by the laser length measuring system 122, and supplied (transmitted) to the position circuit 107. Based on the principle of laser interferometry, the laser length measuring system 122 measures the position of the XY stage 105 by receiving a reflected light from the mirror 216. In the stage coordinate system, the X, Y, and θ directions are set with respect to a plane orthogonal to the optical axis of the multiple primary electron beams, for example.

To the electron gun 201, there is connected a high voltage power supply circuit (not shown). The high voltage power supply circuit applies an acceleration voltage between the filament and the extraction electrode (anode) (which are not shown) in the electron gun 201. In addition to applying the acceleration voltage as described above, by applying a voltage to the extraction electrode (Wehnelt) and heating the cathode at a predetermined temperature, electrons emitted from the cathode are accelerated and emitted as an electron beam 200. For example, electromagnetic lenses are used as the illumination lens 202, the transfer lenses 218 and 219, the reducing lens 205, the objective lens 207, and the projection lenses 224 and 226, and all of them are controlled by the lens control circuit 124. The beam separator 214 is also controlled by the lens control circuit 124. The common blanking deflector 212 is composed of electrodes of at least two poles, and controlled by the blanking control circuit 126. The main deflector 208 is composed of electrodes of at least four poles, and controlled by the deflection control circuit 128 through the DAC amplifier 146 disposed for each electrode. Similarly, the sub deflector 209 is also composed of electrodes of at least four poles, and controlled by the deflection control circuit 128 through the DAC amplifier 144 disposed for each electrode. The aberration corrector 220 is controlled by the aberration corrector control circuit 121. The deflector 228 is composed of electrodes of at least four poles, and controlled by the deflection control circuit 128 through the DAC amplifier 148 arranged for each electrode.

FIG. 1 shows configuration elements necessary for describing the first embodiment. It should be understood that other configuration elements generally necessary for the inspection apparatus 100 may also be included therein.

Figure 2:
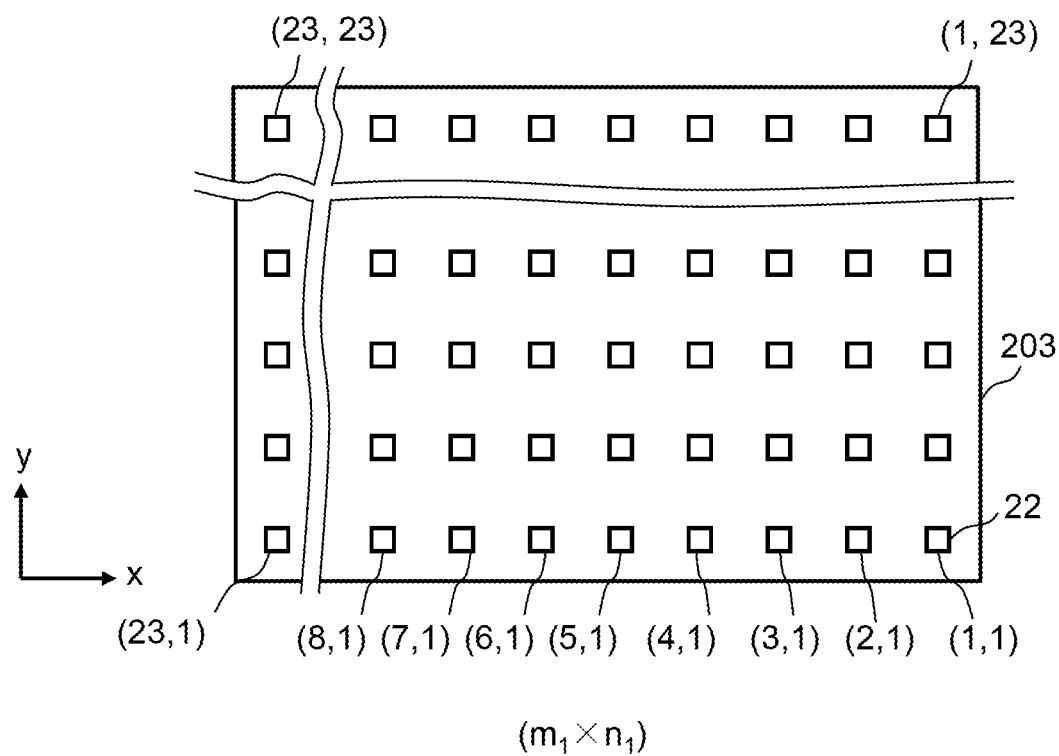
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ columns wide (x direction) and $n_1$ rows long (y direction) are two-dimensionally formed at a predetermined arrangement pitch in the shaping aperture array substrate 203, where $m_1$ and $n_1$ are integers of 2 or greater. In the case of FIG. 2, holes 22 of 23 (columns in x direction)×23 (rows in y direction) are formed. Each of the holes 22 is a quadrangle (rectangle) having the same dimension, shape, and size. Alternatively, each of the holes 22 may be a circle with the same outer diameter. The multiple beams 20 are formed by letting portions of the electron beam 200 individually pass through a corresponding one of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 2 where holes are arranged like a grid in the width and length directions. For example, with respect to the k-th and the (k+1)th rows which are arrayed in the length direction (y direction) and each of which is in the x direction, each hole in the k-th row and each hole in the (k+1)th row may be mutually displaced in the width direction (x direction) by a dimension "a". Similarly, with respect to the (k+1)th and the (k+2)th rows which are arrayed in the length direction (y direction) and each of which is in the x direction, each hole in the (k+1)th row and each hole in the (k+2)th row may be mutually displaced in the width direction (x direction) by a dimension "b".

Figure 3:
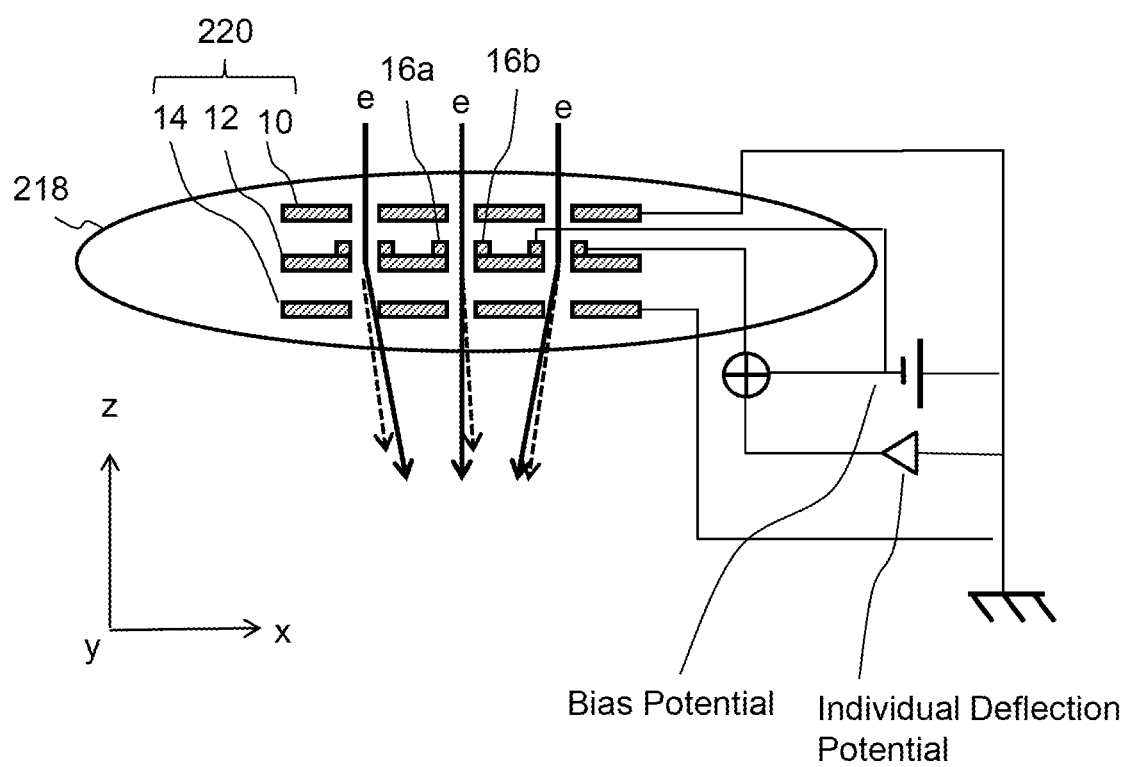
FIG. 3 is a sectional view showing an example of a structure of an aberration corrector and an arrangement position according to the first embodiment.

FIG. 3 is a sectional view showing an example of a structure of an aberration corrector and an arrangement position according to the first embodiment.

Figure 4:
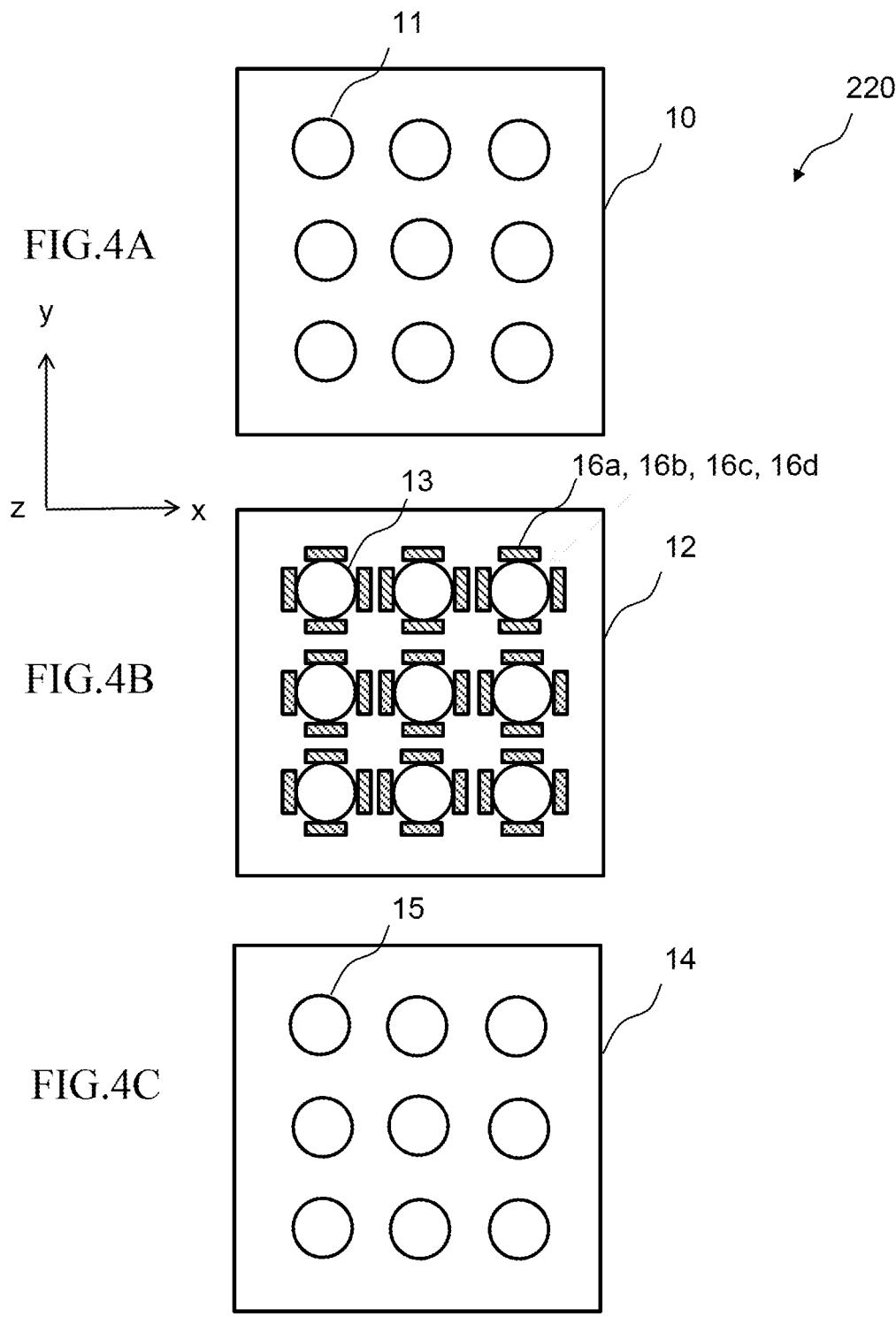
FIGS. 4A to 4C are top views showing examples of electrode substrates of an aberration corrector according to the first embodiment.

FIGS. 4A to 4C are top views showing examples of electrode substrates of an aberration corrector according to the first embodiment. In FIG. 3 and FIGS. 4A to 4C, the aberration corrector 220 is disposed in the magnetic field of the transfer lens 218. The aberration corrector 220 is configured by three or more electrode substrates arranged with predetermined mutual spaces. FIG. 3 and FIGS. 4A to 4C show the aberration corrector 220 configured by three electrode substrates 10, 12, and 14 (a plurality of substrates), for example. In the cases of FIG. 3 and FIGS. 4A to 4C, 3×3 multiple beams 20 are used. A plurality of passage holes through which the multiple beams 20 pass are formed in the electrode substrates 10, 12, and 14. As shown in FIG. 4A, a plurality of passage holes 11 (openings) are formed at the positions, through each of which a corresponding one of the multiple beams 20 (e) passes, of the upper electrode substrate 10. Similarly, as shown in FIG. 4B, a plurality of passage holes 13 (openings) are formed at the positions, through each of which a corresponding one of the multiple beams 20 (e) passes, of the middle electrode substrate 12. Similarly, as shown in FIG. 4C, a plurality of passage holes 15 (openings) are formed at the positions, through each of which a corresponding one of the multiple beams 20 (e) passes, of the lower electrode substrate 14. The upper and lower electrode substrates 10 and 14 are formed from conductive material. Alternatively, a film of conductive material may be applied on the surface of insulating material. A ground potential (GND) is applied to both the upper and lower electrode substrates 10 and 14 by the aberration corrector control circuit 121.

On the other hand, with respect to the middle electrode substrate 12 located between the upper and lower electrode substrates 10 and 14, each passage hole 13 through which a corresponding one of the multiple beams 20 passes is surrounded by an electrode set composed of electrodes 16a, 16b, 16c, and 16d of four or more poles. The electrodes 16a, 16b, 16c, and 16d are formed from conductive material. The electrode substrate 12 is formed, for example, from silicon material. A wiring layer is formed on the electrode substrate 12 by using, for example, MEMS (Micro Electro Mechanical Systems) technology. Then, each of the electrodes 16a, 16b, 16c, and 16d is formed on corresponding wiring in the wiring layer on the electrode substrate 12 such that the electrodes do not electrically conduct with each other. For example, a wiring layer and an insulating layer are formed on the silicon substrate, and then, each of the electrodes 16a, 16b, 16c, and 16d is arranged on the insulating layer and connected to corresponding wiring. It is configured such that, the same bias potential (first trajectory correction potential) can be applied, to each beam independently, to each of the electrodes 16a, 16b, 16c, and 16d in the electrode set for the passage hole 13. A negative potential is applied as the bias potential. Further, it is configured such that, in each electrode set, in order that a potential difference (voltage) may occur between two opposite electrodes 16a and 16b (or/and 16c and 16d) across the passage hole 13, an individual deflection potential (second trajectory correction potential) can be applied to one of the two opposite electrodes, if needed. Therefore, in the aberration corrector control circuit 121, there are arranged, for each passage hole 13 (for each beam), one power supply circuit for applying a bias potential and at least two power supply circuits for applying a deflection potential. If when the electrode set for each passage hole 13 is composed of eight poles, one power supply circuit for applying a bias potential and at least four power supply circuits for applying a deflection potential are arranged for each passage hole 13.

Using the multiple beams 20 each being an electron beam, the image acquisition mechanism 150 acquires an image of a figure pattern, to be inspected, from the substrate 101 on which figure patterns are formed. Hereinafter, operations of the image acquisition mechanism 150 in the inspection apparatus 100 are described.

The electron beam 200 emitted from the electron gun 201 (emission source) almost perpendicularly (e.g., vertically) illuminates the whole of the shaping aperture array substrate 203 by the illumination lens 202. As shown in FIG. 2, a plurality of quadrangular (rectangular) holes 22 (openings) are formed in the shaping aperture array substrate 203. The region including all the plurality of holes 22 is irradiated by the electron beam 200. For example, a plurality of quadrangular electron beams (multiple beams) 20a to 20c (solid lines in FIG. 1) (multiple primary electron beams) are formed by making portions of the electron beam 200, which irradiate the positions of a plurality of holes 22, individually pass through a corresponding one of the plurality of holes 22 in the shaping aperture array substrate 203.

The formed multiple beams 20a to 20c are transmitted by the transfer lenses 218 and 219. In other words, the transfer lenses 218 and 219 receive the multiple beams 20, and refract them. While the multiple beams 20a to 20c pass through the magnetic field of the transfer lens 218, the aberration corrector 220 corrects the image plane aberration by correcting, for each beam, the focus position on the substrate 101 by individually applying a bias potential to each of the multiple beams 20, and individually corrects astigmatism and/or distortion (positional deviation) by individually correcting the beam trajectory by individually applying a deflection potential independently to each beam.

The multiple beams 20a to 20c, whose beam trajectories have been individually corrected, form a crossover (C.O.). After having passed through the beam separator 214 disposed at the crossover position of each of the multiple beams 20, the multiple beams 20a to 20c are reduced by the reducing lens 205, and travel toward the center hole of the limiting aperture substrate 206. At this stage, when all of the multiple beams 20a to 20c are collectively deflected by the common blanking deflector 212, they deviate from the center hole of the limiting aperture substrate 206 so as to be blocked by the limiting aperture substrate 206. On the other hand, when the multiple beams 20a to 20c are not deflected by the common blanking deflector 212, they pass through the center hole of the limiting aperture substrate 206 as shown in FIG. 1. Blanking control is provided by ON/OFF of the common blanking deflector 212 to collectively control ON/OFF of the beams. Thus, the limiting aperture substrate 206 blocks the multiple beams 20a to 20c which were deflected to be in the OFF condition by the common blanking deflector 212. Then, the multiple beams 20a to 20c for inspection are formed by the beams having been made during a period from becoming "beam ON" to becoming "beam OFF" and having passed through the limiting aperture substrate 206.

The multiple beams 20a to 20c which have passed through the limiting aperture substrate 206 and whose trajectories have been individually corrected by a bias potential and a deflection potential beam by the aberration corrector 220 are focused on the substrate 101 (target object) by the objective lens 207 to be a pattern image (beam diameter) of a desired reduction ratio. Then, the whole multiple beams 20 having passed through the limiting aperture substrate 206 are collectively deflected in the same direction by the main deflector 208 and the sub deflector 209 in order to irradiate respective beam irradiation positions on the substrate 101. In such a case, the main deflector 208 collectively deflects all of the multiple beams 20 to the reference position of the mask die to be scanned by the multiple beams 20. According to the first embodiment, scanning is performed while continuously moving the XY stage 105, for example. Therefore, the main deflector 208 performs tracking deflection to follow the movement of the XY stage 105. Then, the sub deflector 209 collectively deflects all of the multiple beams 20 so that each beam may scan a corresponding region. Ideally, the multiple beams 20 irradiating at a time are aligned at the pitch obtained by multiplying the arrangement pitch of a plurality of holes 22 in the shaping aperture array substrate 203 by the desired reduction ratio (1/a) described above. Thus, the electron beam column 102 irradiates the substrate 101 with two-dimensional $m_1 \times n_1$ multiple beams 20 at a time.

A flux of secondary electrons (multiple secondary electron beams 300) (dotted lines in FIG. 1) including reflected electrons, each corresponding to each of the multiple beams 20, is emitted from the substrate 101 due to that desired positions on the substrate 101 are irradiated with the multiple beams 20.

The multiple secondary electron beams 300 emitted from the substrate 101 are refracted toward their center by the objective lens 207, and advance to the center hole of the limiting aperture substrate 206. The multiple secondary electron beams 300 having passed through the limiting aperture substrate 206 pass through the reducing lens 205 and advance to the beam separator 214.

The beam separator 214 generates an electric field and a magnetic field to be orthogonal to each other in a plane orthogonal to the traveling direction (optical axis) of the multiple beams 20. The electric field exerts a force in a fixed direction regardless of the traveling direction of electrons. In contrast, the magnetic field exerts a force according to Fleming's left-hand rule. Therefore, the direction of force acting on electrons can be changed depending on the entering direction of an electron. With respect to the multiple beams 20 (primary electron beams) entering the beam separator 214 from the upper side, since the force due to the electric field and the force due to the magnetic field cancel each other out, the multiple beams 20 travel straight downward. On the other hand, with respect to the multiple secondary electron beams 300 entering the beam separator 214 from the lower side, since both the force due to the electric field and the force due to the magnetic field are exerted in the same direction, the multiple secondary electron beams 300 are bent obliquely upward.

The multiple secondary electron beams 300 bent obliquely upward are projected onto the multi-detector 222 while being refracted by the projection lenses 224 and 226. The multi-detector 222 detects the projected multiple secondary electron beams 300. The multi-detector 222 includes a diode type two-dimensional sensor (not shown). Then, at the position of the diode type two-dimensional sensor corresponding to each of the multiple beams 20, each secondary electron of the multiple secondary electron beams 300 collides with the diode type two-dimensional sensor to produce an electron, and generate secondary electron image data for each pixel. Since scanning is performed while continuously moving the XY stage 105, tracking deflection is provided as described above. Being coincident with the movement of the deflection position along with the tracking deflection, the deflector 228 deflects the multiple secondary electron beams 300 so that they may irradiate respective desired positions on the light receiving surface of the multi-detector 222. The multiple secondary electron beams 300 are detected by the multi-detector 222.

Figure 5:
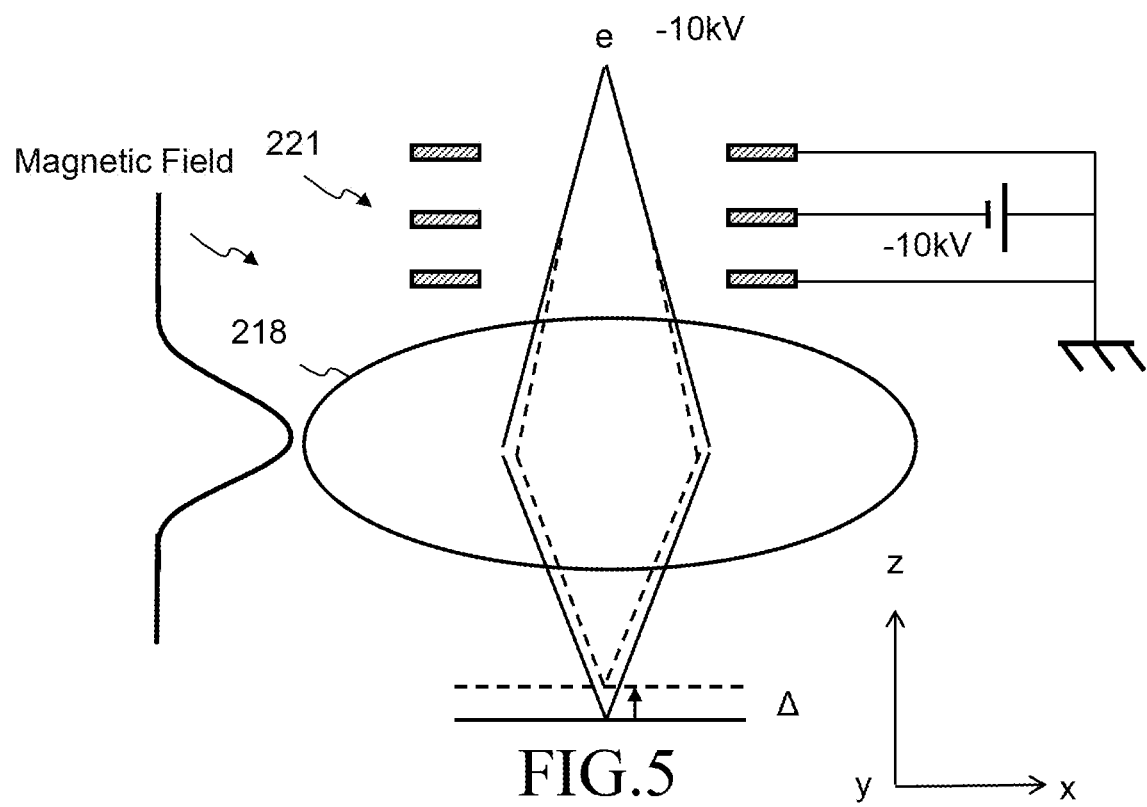
FIG. 5 illustrates a trajectory correction of an electron beam by an aberration corrector according to a comparative example of the first embodiment.

FIG. 5 illustrates a trajectory correction of an electron beam by an aberration corrector according to a comparative example of the first embodiment. In the comparative example of FIG. 5, the aberration corrector 221 is disposed at the position out of the magnetic field space of the transfer lens 218. FIG. 5 shows the case where the aberration corrector 221 is configured by three electrode substrates, and the state where the center beam of the multiple beams passes through them. A ground potential is applied to the upper and lower electrode substrates, and a negative bias potential is applied to the middle electrode substrate. FIG. 5 omits to depict electrodes of four poles on the middle electrode substrate. FIG. 5 shows the case of only a bias potential being applied. Therefore, the structure of FIG. 5 is similar to that of an electrostatic lens with respect to one beam. If the size of the field view of the image acquired in the inspection apparatus 100 is increased, the aberration increases. Furthermore, since the deviation (distortion) of each beam from the design position of the irradiation position on the substrate 101 changes, for each shot of the beam, depending on the deflection position by the sub deflector 209, etc., when performing distortion correction with correction of the focus position, it becomes necessary to dynamically perform the correction for each shot to be described later. In order to correct the aberration by the aberration corrector 221 of the comparative example, for changing the focus position of the intermediate image focused by the transfer lens 218 with respect to, for example, an electron beam (e) emitted at an acceleration voltage of −10 kV and moving at high speed, the bias potential almost equal to the acceleration voltage, such as about −10 kV, is needed. Thus, since the voltage applied to the aberration corrector 221 is too large, electric discharge occurs between the electrode substrates, which may result in difficulty in performing a high-speed switching operation of dynamically correcting the focus position, for each shot of a beam, by the aberration corrector 221. Furthermore, since the voltage is large, a long settling time will be needed, thereby becoming more difficult to perform the high-speed switching operation.

Figure 6:
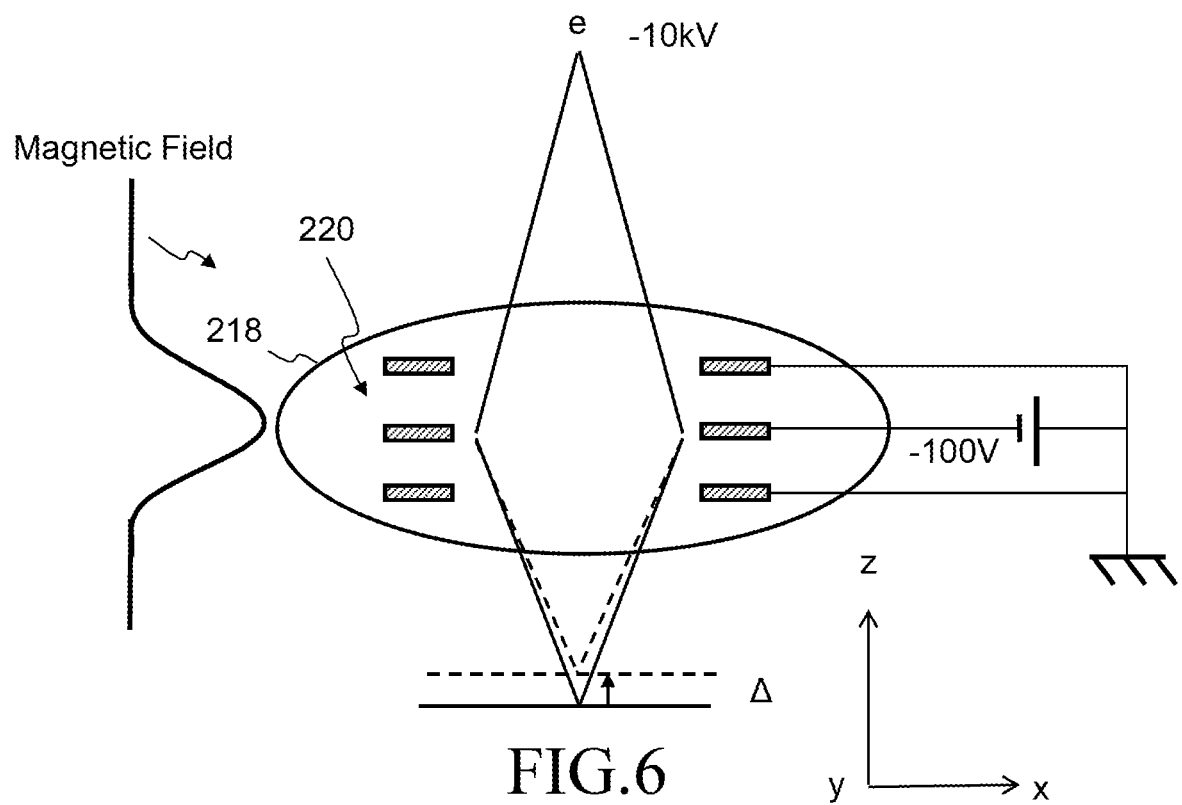
FIG. 6 illustrates a trajectory correction of an electron beam by an aberration corrector according to the first embodiment.

FIG. 6 illustrates a trajectory correction of an electron beam by an aberration corrector according to the first embodiment. In FIG. 6, the aberration corrector 221 of the first embodiment is arranged in the magnetic field of the transfer lens 218. FIG. 6 shows the state where the center beam of the multiple beams passes through the three electrode substrates of the aberration corrector 220. FIG. 6 omits to depict electrodes 16 of four poles on the middle electrode substrate 12. To facilitate understanding of the description, FIG. 6 shows the case of only a bias potential being applied. Therefore, the structure of FIG. 6 is similar to that of an electrostatic lens with respect to one beam. If the size of the field view of the image acquired in the inspection apparatus 100 is increased, the aberration increases. Furthermore, since the deviation (distortion) of each beam from the design position of the irradiation position on the substrate 101 changes, for each shot of the beam, depending on the deflection position by the sub deflector 209, etc., when performing distortion correction with correction of the focus position, it becomes necessary to dynamically perform the correction for each shot to be described later. The aberration corrector 220 individually corrects the focus position of each of the multiple beams 20 by variably controlling the bias potential. Here, for example, if the electron beam (e) emitted at the acceleration voltage of −10 kV and moving at high speed enters the magnetic field of the transfer lens 218, the electron transfer speed becomes slow because of the magnetic field. Therefore, when changing the focus position of the intermediate image focused by the transfer lens 218, since the trajectory of an electron beam is corrected by the aberration corrector 220 in the state where the electron transfer speed is slow, in other words, in the state where the electronic energy is small, it is possible to reduce the bias potential applied to the middle electrode substrate to, for example, about −100 V, being 1/100 of the acceleration voltage of −10 kV, for example. Accordingly, since electric discharge does not occur between the electrode substrates, a high-speed operation can be performed to dynamically correct the focus position, for each shot of a beam, by the aberration corrector 220. Furthermore, since the bias potential to be applied can be reduced, the settling time can be shortened because of the reduction. Thus, the operation switching time can be shortened, and therefore, a high-speed switching operation can be performed easily. Thereby, it is possible to dynamically correct image plane aberration (image plane (field) curvature).

FIGS. 7A and 7B show examples of the size of an irradiating beam according to the first embodiment. Specifically, FIGS. 7A and 7B show examples of sizes of five beams to irradiate the substrate 101, which are arranged in the x direction with centering on the center beam 31a of the multiple beams 20. If a plurality of holes 22 are formed in a matrix in the x and y directions at a predetermined pitch in the shaping aperture array substrate 203, ideally, as shown in FIG. 7B, the beam sizes of the multiple beams 20 to irradiate the substrate 101 should be the same and arranged in a line. However, when the optical system of electromagnetic lenses, etc., such as the illumination lens 202, transfer lenses 218 and 219, reducing lens 205, and/or objective lens 207 is used, the beam sizes on the substrate 101 become larger in the order of the center beam 31a, the beam 31b, and the beam 31c due to image plane curvature etc., as shown in FIG. 7A. That is, the outer side the beam is located, the larger the beam size on the substrate 101 becomes. Even though a certain amount of tendency exists in the beam size change, it differs for each beam. In pattern inspection, if the beam sizes are different from each other, since the number of emitted secondary electrons changes, the detection sensitivity becomes varied. Therefore, acquired images vary, which may easily generate a false defect and lead to overlooking a defect. The image plane curvature can be corrected by shifting the focus position of each beam on the substrate 101. Then, according to the first embodiment, the aberration corrector 220 corrects the image plane curvature by individually correcting the focus position of each of the multiple beams 20. In such a case, as shown in FIG. 7B, the aberration corrector 220 corrects the beam diameter of the center beam and those of the other beams to be the same as each other by performing correction such that the small beam size is changed (corrected) to the large one, in other words, the sizes of the other beams are changed (corrected) to the largest beam size. The beam size can be adjusted by shifting (correcting) the focus position on the substrate 101.

Although blur increases because the adjustment is made on the basis of the large beam size, the detection sensitivities become equivalent among the beams.

Although depiction of the electrodes 16 of four poles is omitted in the example of FIG. 6, according to the first embodiment, in addition to the correction of image plane aberration (image plane curvature), further, deviation (distortion aberration) of the irradiation position of each beam from the design position on the substrate 101, and astigmatism are corrected simultaneously.

Figure 8A:
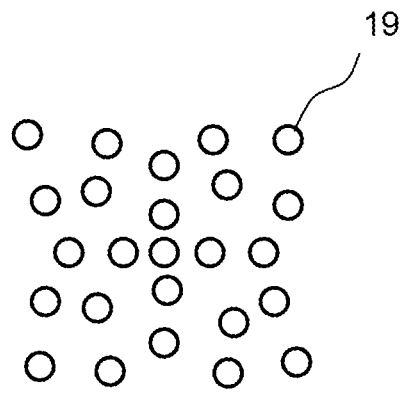
FIGS. 8A and 8B show an example of distortion according to the first embodiment.
Figure 8B:
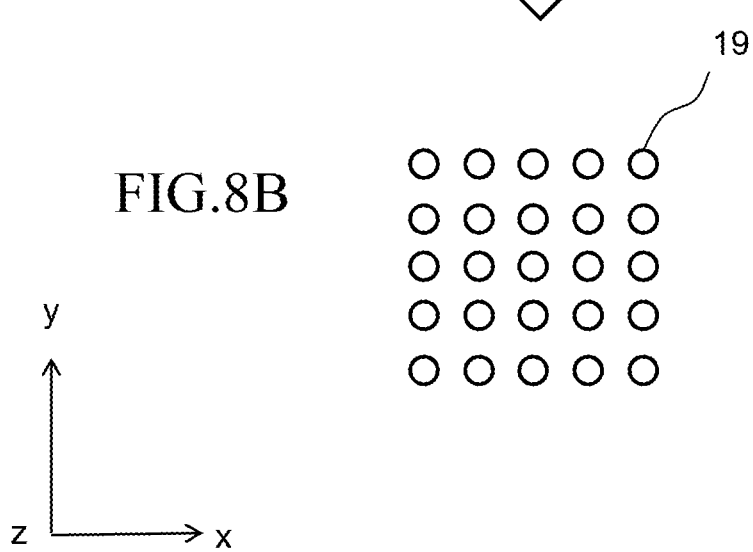

FIGS. 8A and 8B show an example of distortion aberration (distortion) according to the first embodiment. In the case of FIGS. 8A and 8B, 5×5 multiple beams 20 are used. If a plurality of holes 22 are formed in a matrix in the x and y directions at a predetermined pitch in the shaping aperture array substrate 203, ideally, as shown in FIG. 8B, irradiation positions 19 of the multiple beams 20 on the substrate 101 should also be arranged in a matrix with a predetermined reduction ratio. However, when the optical system of electromagnetic lenses, etc., such as the illumination lens 202, transfer lenses 218 and 219, reducing lens 205, and/or objective lens 207 is used, distortion (distortion aberration) occurs as shown in FIG. 8A. With respect to the shape of the distortion, depending on conditions, it represents a distribution called a barrel type or a pincushion type. Generally, distortion of a magnetic lens shifts not only in the radial direction but also in the rotational direction. FIG. 8A shows the case under conditions of not generating rotational components. Even though a certain amount of tendency exists in the direction of distortion and the amount of positional deviation in the multiple beams 20, it differs for each beam. Therefore, in order to correct such distortion, it is necessary to perform correction for each individual beam. Then, according to the first embodiment, the beam trajectory is corrected for each beam by the aberration corrector 220.

Figure 9A:
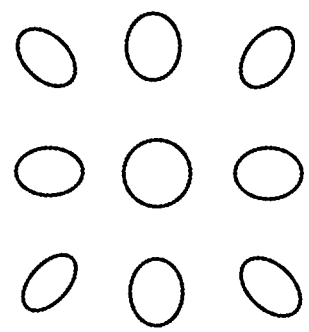
FIGS. 9A and 9B show an example of astigmatism according to the first embodiment.
Figure 9B:
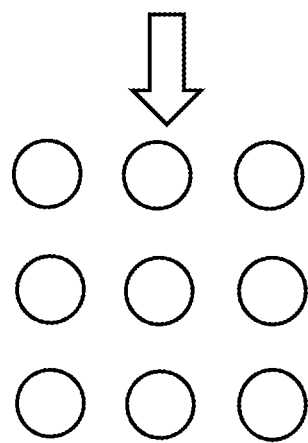

FIGS. 9A and 9B show an example of astigmatism according to the first embodiment. In the case of FIGS. 9A and 9B, 3×3 multiple beams 20 are used. As shown in FIG. 9B, ideally, irradiation of each beam is circular. However, when the optical system of electromagnetic lenses, etc., such as the illumination lens 202, transfer lenses 218 and 219, reducing lens 205, and/or objective lens 207 is used, astigmatism occurs as shown in FIG. 9A. Therefore, as shown in FIG. 9A, the focus position shifts in the two-dimensional x and y directions on the substrate 101 (target object), which makes the beam a so-called elliptic form at the focus position, and thus, blur occurs in the irradiating beam. Although the direction of astigmatism and the amount of positional deviation in the multiple beams 20 tend to become an elliptic form extending radially from the center of the multiple beams 20, it differs for each beam. Therefore, in order to correct such astigmatism, it is necessary to perform correction for each individual beam. Then, according to the first embodiment, in addition to distortion, further, astigmatism is corrected by correcting the beam trajectory of each beam by the aberration corrector 220.

Figure 10:
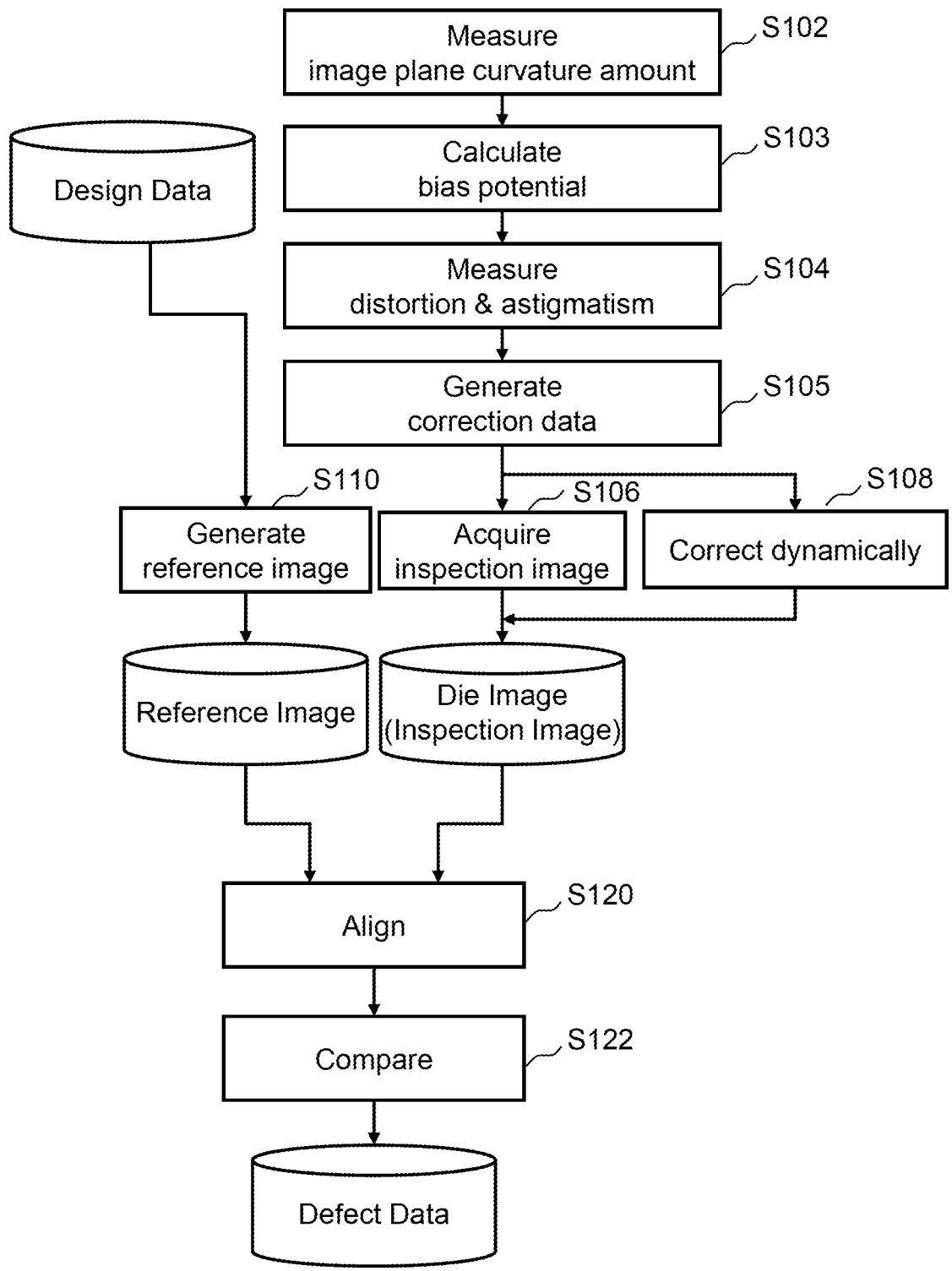
FIG. 10 is a flowchart showing main steps of a multiple beam inspection method according to the first embodiment.

FIG. 10 is a flowchart showing main steps of a multiple beam inspection method according to the first embodiment. In FIG. 10, the multiple beam inspection method of the first embodiment executes a series of steps: an image plane curvature amount measuring step (S102), a bias potential calculating step (S103), a distortion & astigmatism measuring step (S104), a correction data generating step (S105), an inspection image acquiring step (S106), a dynamic correcting step (S108), a reference image generating step (S110), an alignment step (S120), and a comparing step (S122). The image plane curvature amount measuring step (S102), the distortion & astigmatism measuring step (S104), the correction data generating step (S105), the dynamic correcting step (S108), and the inspection image acquiring step (S106) shown in FIG. 10 are also main steps of the multiple beam irradiation method of the first embodiment.

In the image plane curvature amount measuring step (S102), first, the inspection apparatus 100 measures image plane curvature. The result of measurement is stored in the storage device 109.

In the bias potential calculating step (S103), the correction data generation circuit 130 calculates an individual bias potential of each beam applied to the electrode 16 for each beam of the aberration corrector 220 which corrects the measured image plane curvature. Alternatively, by experiment, the bias potential of each beam for correcting the image plane curvature may be adjusted while the bias potential of each beam is being varied. Data of the adjusted bias potential of each beam for correcting the image plane curvature is output to the correction data generation circuit 130.

In the distortion & astigmatism measuring step (S104), the inspection apparatus 100 measures a distortion and astigmatism. However, the amount of the distortion and astigmatism is the total of two amounts: one amount is based on the beam shape depending on the position of the shaping aperture, and on a processing error of the shaping aperture, and the other amount is varied according to the deflection amount by the main and sub deflectors 208 and 209 for each shot even when beams at the same position (hereinafter, called "the same beam") passing through the same hole 22 of the shaping aperture array substrate 203 are used. Therefore, the distortion and astigmatism generated in each shot state is measured. The result of the measurement is stored in the storage device 109. In addition, since the distortion and astigmatism may change due to correction of the image plane curvature, it is preferable to measure the distortion and astigmatism in the state where a bias potential of each beam for correcting the image plane curvature has been applied.

In the correction data generating step (S105), the correction data generation circuit 130 calculates, in addition to the data of bias potential, a deflection potential for correcting the distortion and astigmatism, and generates data of individual deflection potential of each beam to be applied to the electrode 16 for each beam of the aberration corrector 220 corresponding to the deflection amount for each shot. The generated data of individual bias potential and individual deflection potential of each beam are output to the aberration corrector control circuit 121 in order of shot. Since the irradiation position in order of shot of the multiple beams 20 is determined by the inspection sequence, it is preferable to rearrange the data of individual bias potential and individual deflection potential of each beam in advance along with the inspection sequence in the correction data generation circuit 130.

In the inspection image acquiring step (S106), the image acquisition mechanism 150 acquires a secondary electron image of the pattern formed on the substrate 101 (target object), by using the multiple beams 20 having passed through the aberration corrector 220. Specifically, it operates as follows: As described above, the multiple beams 20a to 20c formed by the shaping aperture array substrate 203 are transmitted by the transfer lenses 218 and 219.

While passing through the magnetic field of the transfer lens 218, the beam trajectory of each of the multiple beams 20a to 20c is corrected by the aberration corrector 220 as described later. The multiple beams 20a to 20c whose trajectories have been individually corrected pass through the beam separator 214, the reducing lens 205, the common blanking deflector 212, and the limiting aperture substrate 206, and are focused on the substrate 101 (target object) by the objective lens 207 in order to irradiate respective beam irradiation positions on the substrate 101 by the main deflector 208 and the sub deflector 209.

A flux of secondary electrons (multiple secondary electron beams 300) (dotted lines in FIG. 1) including reflected electrons, each corresponding to each of the multiple beams 20, is emitted from the substrate 101 due to that desired positions on the substrate 101 are irradiated with the multiple beams 20. The multiple secondary electron beams 300 emitted from the substrate 101 pass through the objective lens 207 and the reducing lens 205, and advance to the beam separator 214 so as to be bent diagonally upward. The multiple secondary electron beams 300 having been bent diagonally upward are projected, with being refracted, onto the multi-detector 222 by the projection lenses 224 and 226.

Figure 11:
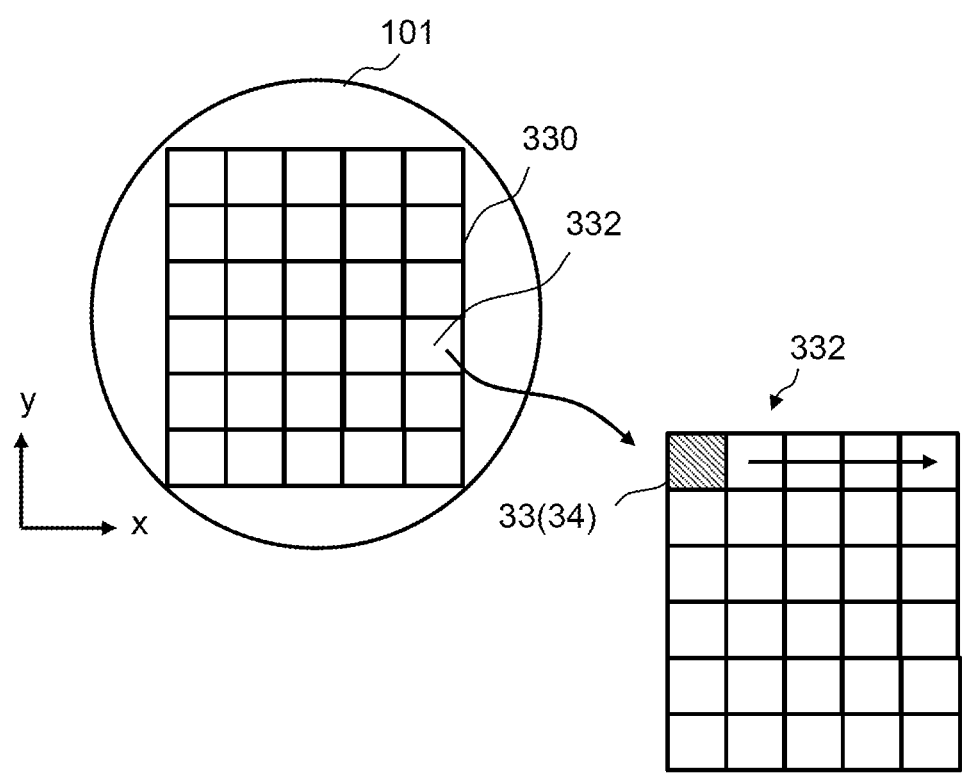
FIG. 11 shows an example of a plurality of chip regions formed on a semiconductor substrate according to the first embodiment.

FIG. 11 shows an example of a plurality of chip regions formed on a semiconductor substrate of the first embodiment. In FIG. 11, when the substrate 101 is a semiconductor substrate (wafer), a plurality of chips (wafer die) 332 in a two-dimensional array are formed in an inspection region 330 of the semiconductor substrate 101. A mask pattern for one chip formed on the exposure mask substrate is reduced to ¼, for example, and exposed/transferred onto each chip 332 by an exposure device (stepper) (not shown). The inside of each chip 332 is divided into a plurality of mask dies 33 of $m_2$ columns wide (width in the x direction) and $n_2$ rows long (length in the y direction) (each of $m_2$ and $n_2$ is an integer of 2 or greater), for example. In the first embodiment, the mask die 33 serves as a unit inspection region.

Figure 12:
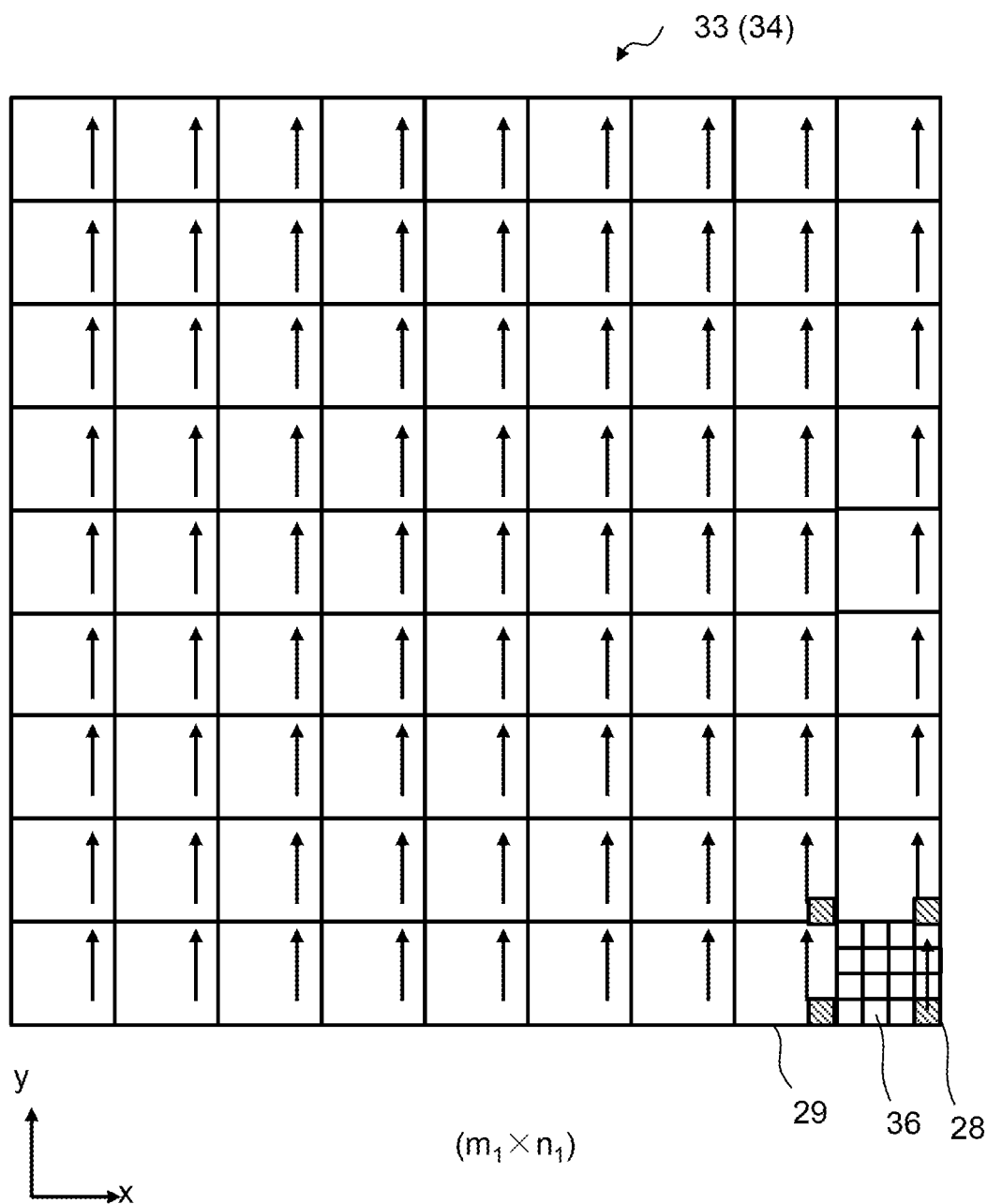
FIG. 12 shows an example of an irradiation region of multiple beams and a measurement pixel according to the first embodiment.

FIG. 12 shows an example of an irradiation region of multiple beams and a measurement pixel according to the first embodiment. In FIG. 12, each mask die 33 is divided into a plurality of mesh regions, for example, by the size of each beam of multiple beams. Each mesh region serves as a measurement pixel 36 (unit irradiation region). FIG. 12 shows the case of multiple beams of 9×9 (rows by columns). The size of the irradiation region 34 that can be irradiated with one irradiation of the multiple beams 20 is defined by (x direction size obtained by multiplying pitch between beams in x direction of the multiple beams 20 on the substrate 101 by the number of beams in the x direction)×(y direction size obtained by multiplying pitch between beams in y direction of the multiple beams 20 on the substrate 101 by the number of beams in the y direction). In the case of FIG. 12, the irradiation region 34 and the mask die 33 are of the same size. However, it is not limited thereto. The irradiation region 34 may be smaller than the mask die 33, or larger than it. In the irradiation region 34, there are shown a plurality of measurement pixels 28 (irradiation positions of beams of one shot) which can be irradiated with one irradiation of the multiple beams 20. In other words, the pitch between adjacent measurement pixels 28 serves as the pitch between beams of the multiple beams. In the example of FIG. 12, one sub-irradiation region 29 is a square region surrounded at four corners by four adjacent measurement pixels 28, and including one of the four measurement pixels 28. In the example of FIG. 12, each sub-irradiation region 29 is composed of 4×4 pixels 36.

In the scanning operation according to the first embodiment, scanning is performed for each mask die 33. FIG. 12 shows the case of scanning one mask die 33. When all of the multiple beams 20 are used, there are arranged $m_1 \times n_1$ sub-irradiation regions 29 in the x and y directions two-dimensionally) in one irradiation region 34. The XY stage 105 is moved to a position where the first mask die 33 can be irradiated with the multiple beams 20. While the main deflector 208 performs tracking deflection to follow the movement of the XY stage 105, the inside of the mask die 33 concerned, regarding the mask die 33 concerned as the irradiation region 34, is scanned in the state of being tracking-deflected. Each of the multiple beams 20 is associated with any one of the sub-irradiation regions 29 which are different from each other. At the time of each shot, each beam irradiates one measurement pixel 28 corresponding to the same position in the associated sub-irradiation region 29. In the case of FIG. 12, the main deflector 208 performs deflection such that the first shot of each beam irradiates the first measurement pixel 36 from the right in the bottom row in the sub-irradiation region 29 concerned. Thus, irradiation of the first shot is performed. Then, the beam deflection position is shifted in the y direction by the amount of one measurement pixel 36 by collectively deflecting all of the multiple beams 20 by the main deflector 208, and the second shot irradiates the first measurement pixel 36 from the right in the second row from the bottom in the sub-irradiation region 29 concerned. Similarly, the third shot irradiates the first measurement pixel 36 from the right in the third row from the bottom in the sub-irradiation region 29 concerned. The fourth shot irradiates the first measurement pixel 36 from the right in the fourth row from the bottom in the sub-irradiation region 29 concerned. Next, the beam deflection position is shifted to the second measurement pixel 36 from the right in the bottom row by collectively deflecting all of the multiple beams 20 by the main deflector 208. Similarly, the measurement pixels 36 are irradiated in order in the y direction. By repeating this operation, one beam irradiates all the measurement pixels 36 in order in one sub-irradiation region 29. By performing one shot, the multiple secondary electron beams 300 corresponding to a plurality of shots whose maximum number is the same as the number of a plurality of holes 22 are detected at a time by the multiple beams formed by passing through the plurality of holes 22 in the shaping aperture array substrate 203.

As described above, the whole multiple beams 20 scans the mask die 33 as the irradiation region 34, and that is, each beam individually scans one corresponding sub-irradiation region 29. After scanning one mask die 33 is completed, the irradiation region 34 is moved to a next adjacent mask die 33 in order to scan the next adjacent mask die 33. This operation is repeated to proceed scanning of each chip 332. Due to shots of the multiple beams 20, secondary electrons are emitted from the irradiated measurement pixels 36 at each shot time to be detected by the multi-detector 222. According to the first embodiment, the multi-detector 222 detects the secondary electron emitted upward from each measurement pixel 36, for each measurement pixel 36 (or each sub-irradiation region 29) which is a unit detection region of the detector 222.

By performing scanning using the multiple beams 20 as described above, the scanning operation (measurement) can be performed at a speed higher than that of scanning by a single beam. The scanning of each mask die 33 may be performed by the "step and repeat" operation, alternatively it may be performed by continuously moving the XY stage 105. When the irradiation region 34 is smaller than the mask die 33, the scanning operation may be performed while moving the irradiation region 34 in the mask die 33 concerned.

When the substrate 101 is an exposure mask substrate, the chip region for one chip formed on the exposure mask substrate is divided into a plurality of stripe regions in a strip form by the size of the mask die 33 described above, for example. Then, for each stripe region, scanning is performed for each mask die 33 in the same way as described above. Since the size of the mask die 33 on the exposure mask substrate is the size before being transferred and exposed, it is four times the mask die 33 on the semiconductor substrate. Therefore, if the irradiation region 34 is smaller than the mask die 33 on the exposure mask substrate, the scanning operation for one chip increases (e.g., four times). However, since a pattern for one chip is formed on the exposure mask substrate, the number of times of scanning can be less compared to the case of the semiconductor substrate on which more than four chips are formed.

As described above, using the multiple beams 20, the image acquisition mechanism 150 scans the substrate 101 to be inspected, on which a figure pattern is formed, and detects the multiple secondary electron beams 300 emitted from the inspection substrate 101 due to it being irradiated with the multiple beams 20. Detected data on a secondary electron (measured image: secondary electron image: image to be inspected) from each measurement pixel 36 detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed on the substrate 101. Then, for example, when the detected data for one chip 332 has been accumulated, the accumulated data is transmitted as chip pattern data to the comparison circuit 108, with information data on each position from the position circuit 107.

In the dynamic correcting step (S108), in parallel to the inspection image acquiring step (S106), the aberration corrector 220 arranged in the magnetic field of the transfer lens 218 individually corrects the image plane curvature of a corresponding beam by using the electrodes 16 of four or more poles, with respect to each of a plurality of electrode sets. Moreover, the aberration corrector 220 individually corrects the astigmatism of a corresponding beam by using the electrodes 16 of four or more poles, with respect to each of a plurality of electrode sets. Further, the aberration corrector 220 individually corrects distortion of a corresponding beam from the design position on the substrate 101 (target object) by using the electrodes 16 of four or more poles, with respect to each of a plurality of electrode sets. Specifically, it operates as follows: The trajectory of each of the multiple beams 20 passing through the transfer lens 218 is corrected by the aberration corrector 220 to which an individual bias potential of each beam for correcting image plane curvature and an individual deflection potential of each beam for correcting distortion and astigmatism have been applied from the aberration corrector control circuit 121. Data of the individual bias potential and data of the individual deflection potential are dynamically controlled according to the deflection amount of the aberration corrector 220 are dynamically controlled, for each shot, according to the deflection amount for collectively deflecting the multiple beams 20.

In the reference image generating step (S110), the reference image generation circuit 112 (reference image generation unit) generates a reference image corresponding to an inspection image to be inspected. Based on design data serving as a basis for forming a pattern on the substrate 101, or design pattern data defined in exposure image data of a pattern formed on the substrate 101, the reference image generation circuit 112 generates a reference image for each frame region. Preferably, for example, the mask die 33 is used as the frame region. Specifically, it operates as follows: First, design pattern data is read from the storage device 109 through the control computer 110, and each figure pattern defined in the read design pattern data is converted into image data of binary or multiple values.

Here, basics of figures defined by design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data, used as figure data, is input to the reference image generation circuit 112, the data is developed into data of each figure. Then, the figure code, the figure dimensions and the like indicating the figure shape in the data of each figure are interpreted. Then, the reference image generation circuit 112 develops each figure data to design pattern image data of binary or multiple values as a pattern to be arranged in a mesh region in units of grids of predetermined quantization dimensions, and outputs the developed data. In other words, the reference image generation circuit 112 reads design data, calculates an occupancy rate occupied by a figure in the design pattern, for each mesh region obtained by virtually dividing an inspection region into grid squares in units of predetermined dimensions, and outputs n-bit occupancy rate data. For example, it is preferable that one mesh region is set as one pixel. Assuming that one pixel has a resolution of $1/2^8 (=1/256)$, the occupancy rate in each pixel is calculated by allocating small regions which correspond to the region of figures arranged in the pixel concerned and each of which is corresponding to a $1/256$ resolution. Then, 8-bit occupancy rate data is output to the reference circuit 112. The mesh region (inspection pixel) can be in accordance with the pixel of measured data.

Next, the reference image generation circuit 112 performs appropriate filter processing on design image data of a design pattern which is image data of a figure. Since optical image data as a measured image is in the state affected by filtering performed by the optical system, in other words, in the analog state continuously changing, it is possible to match/fit the design image data with the measured data by also applying a filtering process to the design image data being image data on the design side whose image intensity (gray value) is represented by digital values. The generated image data of a reference image is output to the comparison circuit 108.

Figure 13:
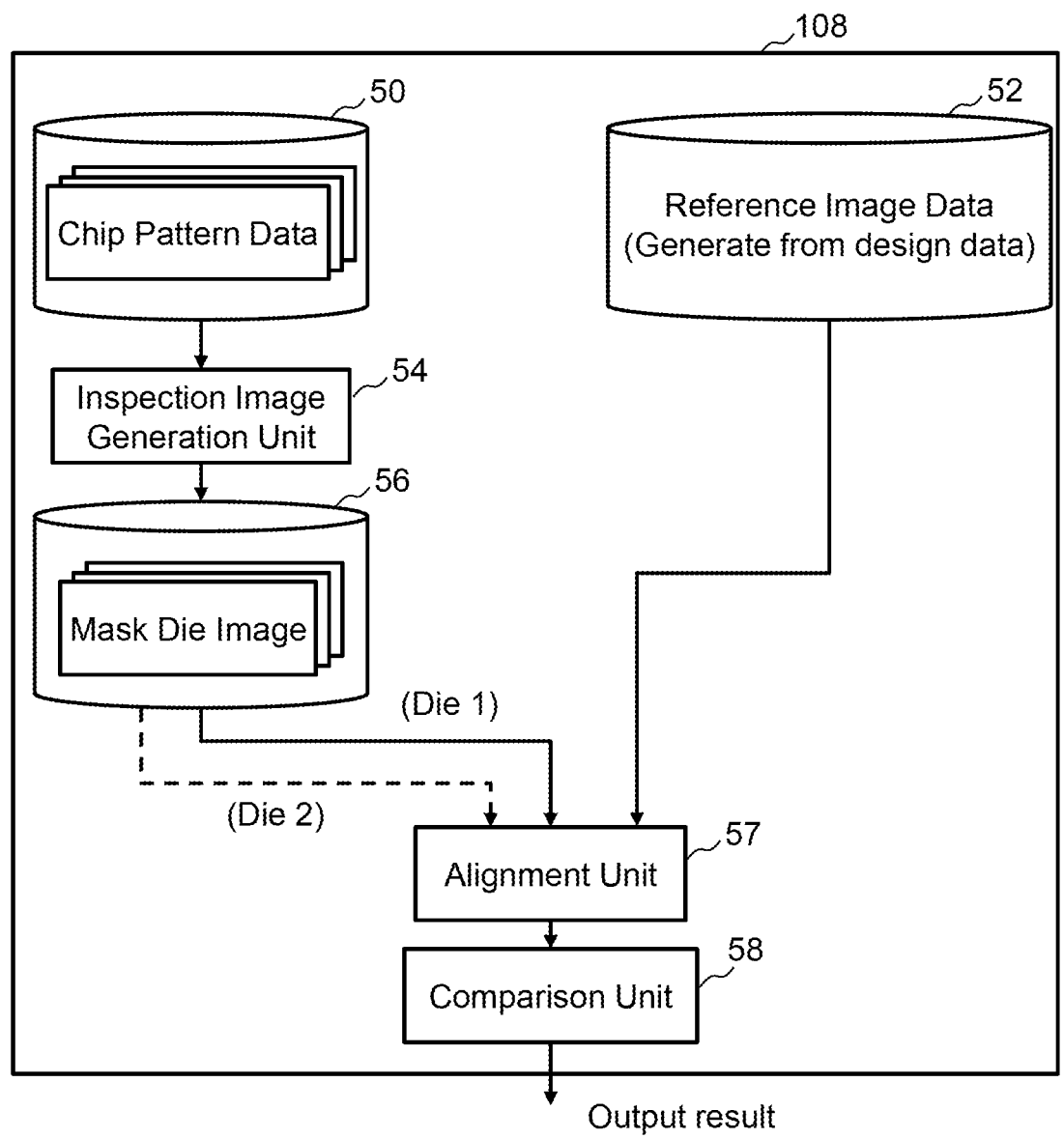
FIG. 13 shows an internal configuration of a comparison circuit according to the first embodiment.

FIG. 13 shows an internal configuration of a comparison circuit according to the first embodiment. In FIG. 13, storage devices 50, 52 and 56, such as magnetic disk drives, an inspection image generation unit 54, an alignment unit 57, and a comparison unit 58 are disposed in the comparison circuit 108. Each of the "units" such as the inspection image generation unit 54, the alignment unit 57, and the comparison unit 58 includes a processing circuitry. As the processing circuitry, for example, an electric circuit, computer, processor, circuit board, quantum circuit, semiconductor device, or the like can be used. Each of the "units" may use a common processing circuitry (same processing circuitry), or different processing circuitries (separate processing circuitries). Input data required in the inspection image generation unit 54, the alignment unit 57, and the comparison unit 58, and calculated results are stored in a memory (not shown) or in the memory 118 each time.

In the comparison circuit 108, the transmitted stripe pattern data (or chip pattern data) is temporarily stored in the storage device 50, with information indicating each position from the position circuit 107. Moreover, transmitted reference image data is temporarily stored in the storage device 52.

Next, the inspection image generation unit 54 generates a frame image (inspection image, that is, image to be inspected) by using stripe pattern data (or chip pattern data), for each frame region (unit inspection region) of a predetermined size. As the frame image, here, an image of the mask die 33 is generated, for example. However, the size of the frame region is not limited thereto. The generated frame image (e.g., mask die image) is stored in the storage device 56.

In the alignment step (S120), the alignment unit 57 reads the mask die image being an inspection image, and the reference image corresponding to the mask die image, and provides alignment between the images based on a sub-pixel unit smaller than the pixel 36. For example, the alignment (positioning) may be performed by a least-squares method.

In the comparing step (S122), the comparison unit 58 compares the mask die image (inspection image) and the reference image concerned. The comparison unit 58 compares, for each pixel 36, both the images, based on predetermined determination conditions in order to determine whether there is a defect such as a shape defect. For example, if a gray scale value difference for each pixel 36 is larger than a determination threshold Th, it is determined that there is a defect. Then, the comparison result is output, and specifically, output to the storage device 109, monitor 117, or memory 118, or alternatively, output from the printer 119.

Figure 14A:
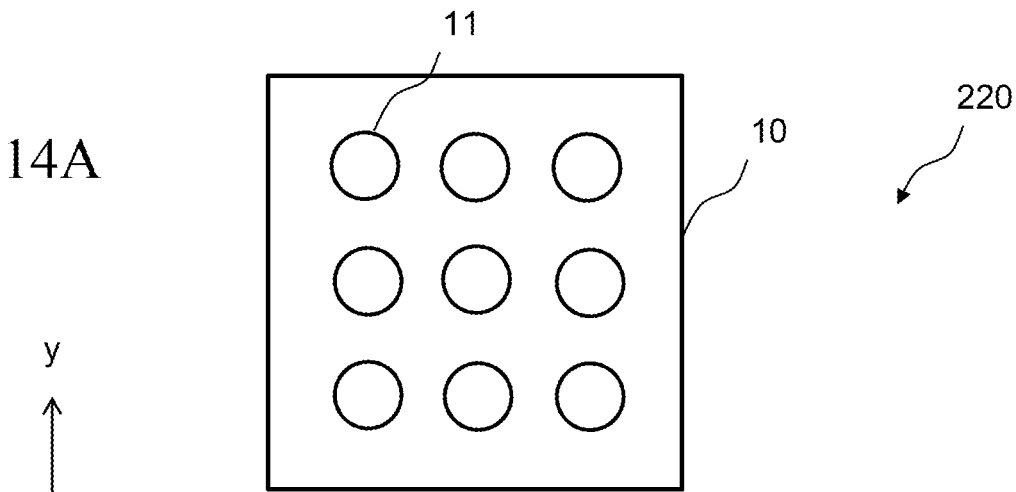
FIGS. 14A to 14C are top views showing examples of electrode substrates of an aberration corrector according to a modified example of the first embodiment.
Figure 14B:
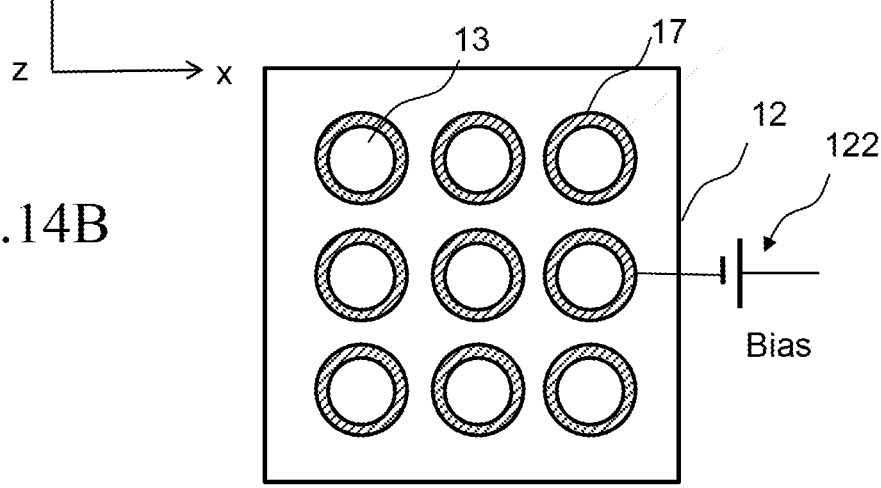
Figure 14C:
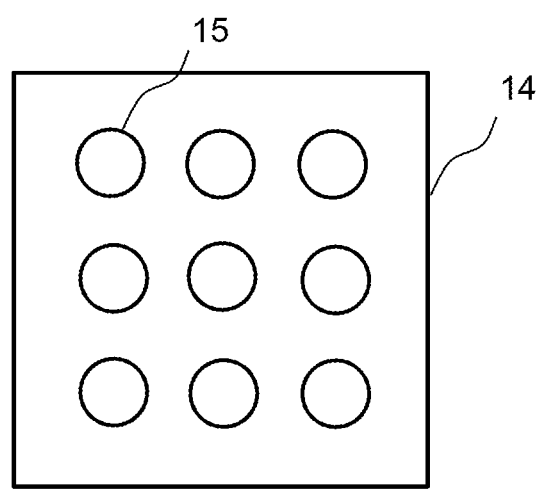

FIGS. 14A to 14C are top views showing examples of electrode substrates of an aberration corrector according to a modified example of the first embodiment. In FIGS. 14A to 14C, similarly to the first embodiment, the aberration corrector 220 is arranged in the magnetic field of the transfer lens 218. As shown in FIG. 14A, the configuration of the upper electrode substrate 10 is the same as that of FIG. 4A. As shown in FIG. 14C, the configuration of the lower electrode substrate 14 is the same as that of FIG. 4C. Then, similarly to the first embodiment, a ground potential (GND) is applied to both the upper and lower electrode substrates 10 and 14 by the aberration corrector control circuit 121.

On the other hand, with respect to the middle electrode substrate 12 located between the upper and lower electrode substrates 10 and 14, as shown in FIG. 14B, an annular electrode 17 is arranged surrounding each passage hole 13 for each of the multiple beams 20. The annular electrode 17 is formed from conductive material. As long as a bias potential is individually applied to each beam, it is sufficient to provide the annular electrode 17 instead of the electrodes 16 of four or more poles. By individually applying a bias potential to each beam, the focus position of each beam can be corrected individually. Therefore, it is possible to correct the image plane curvature and to adjust the beam size on the substrate 101. Moreover, as described above, since the aberration corrector 220 is disposed in the magnetic field of the transfer lens 218, the bias potential can be reduced.

According to the first embodiment, as described above, in irradiation with multiple electron beams, it is possible to reduce aberration or/and distortion, etc. by using a potential lower than that used before. Therefore, it is possible to switch potentials at high speed without causing electric discharge, and dynamically correct the trajectory of each of the multiple electron beams of each shot.

Second Embodiment

In the above first embodiment, the bias potential and the deflection potential to be applied to the electrode set (electrodes 16a, 16b, 16c, and 16d of four poles) of each passage hole 13 of the aberration corrector 220 is controlled individually. Therefore, it is necessary to provide, for each passage hole 13 (for each beam), one power supply circuit for applying a bias potential and at least two power supply circuits for applying a deflection potential. If separately (independently) using the power supply circuit for applying a deflection potential for correcting astigmatism, and the power supply circuit for applying a deflection potential for correcting distortion, the number of power supply circuits further increases. If in the case of the electrode set for each passage hole 13 being composed of eight poles, one power supply circuit for applying a bias potential and at least four power supply circuits for applying a deflection potential need to be provided for each passage hole 13. Then, the second embodiment describes a configuration capable of reducing such power supply circuits. The configuration of the inspection apparatus 100 is the same as that of FIG. 1. Moreover, the flowchart showing an example of the main steps of the multiple beam inspection method according to the second embodiment is the same as that of FIG. 10. The contents of the second embodiment are the same as those of the first embodiment except for what is specifically described below.

Figure 15:
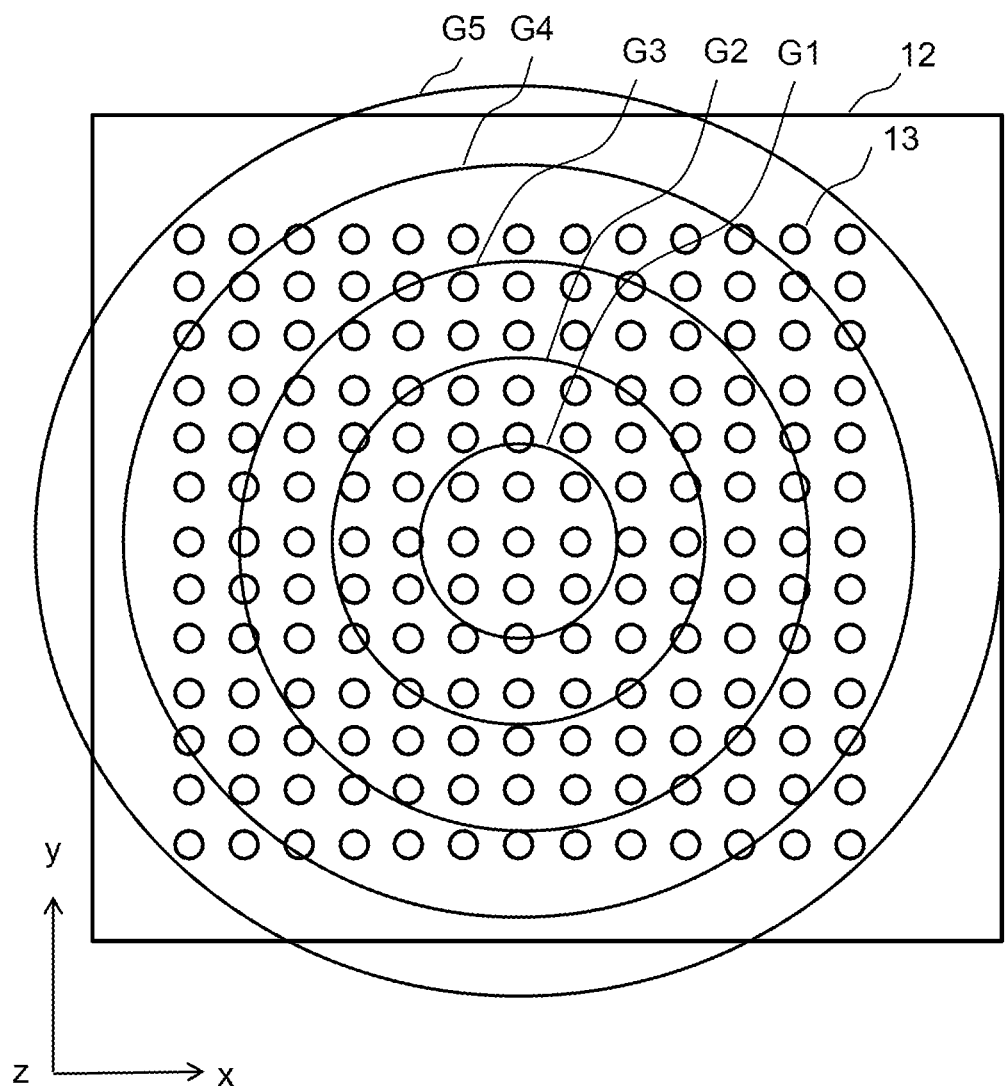
FIG. 15 illustrates grouping of electrode sets according to a second embodiment.

FIG. 15 illustrates grouping of electrode sets according to the second embodiment. In the case of FIG. 15, 13×13 multiple beams are used. In FIG. 15, on the middle electrode substrate 12 of the aberration corrector 220, 13×13 passage holes 13 are formed to be corresponding to the arrangement number of the multiple beams. Moreover, an electrode set composed of electrodes 16a, 16b, 16c, and 16d of four or more poles (not shown) is arranged around each passage hole 13. Here, deviation caused by the image plane curvature becomes large radially in order from the center beam to the outer side. According to the second embodiment, a plurality of passage holes 13 (and electrode sets) are grouped based on a plurality of concentric circles outward from the center beam to the outer side. In the example of FIG. 15, the grouping is performed into a group 1 (G1) of the passage holes 13 (and electrode sets) located in the circle including the center beam, a group 2 (G2) of the passage holes 13 (and electrode sets) located in the concentric circle second from the center, a group 3 (G3) of the passage holes 13 (and electrode sets) located in the concentric circle third from the center, a group 4 (G4) of the passage holes 13 (and electrode sets) located in the concentric circle fourth from the center, and a group 5 (G5) of the passage holes 13 (and electrode sets) located in the concentric circle fifth from the center. Since the amount of image plane curvature generated with respect to each beam in the same group is around the same as each other, it is sufficient to perform correction using the same correction amount. Then, according to the second embodiment, the bias potential applied to the electrode set (electrodes 16a, 16b, 16c, and 16d of four poles) corresponding to each passage hole 13 (beam) is made to be common in each group. Thereby, the power supply circuit for applying the bias potential can be used in common in each group. In other words, the number of the power supply circuits for applying the bias potential can be reduced to the number of the groups.

The phenomemon of becoming large radially in order from the center beam to the outer side also occurs in the astigmatism as shown in FIG. 9B. In order to correct the astigmatism, it is necessary to produce an electric potential difference between opposite electrodes in the electrodes 16*a*, 16*b*, 16*c*, and 16*d* of four or more poles for each beam. However, as shown in FIG. 4B, the electrodes 16*a*, 16*b*, 16*c*, and 16*d* of four or more poles around each passage hole 13 are arranged along the x-y coordinate system. Therefore, since the direction of the arrangement is not radial, the deflection potential applied to the electrodes 16*a* and 16*c* cannot be made to be common even the electrodes are in the same group, whereas GND potentials are applied to the electrodes 16*b* and 16*d*.

Figure 16:
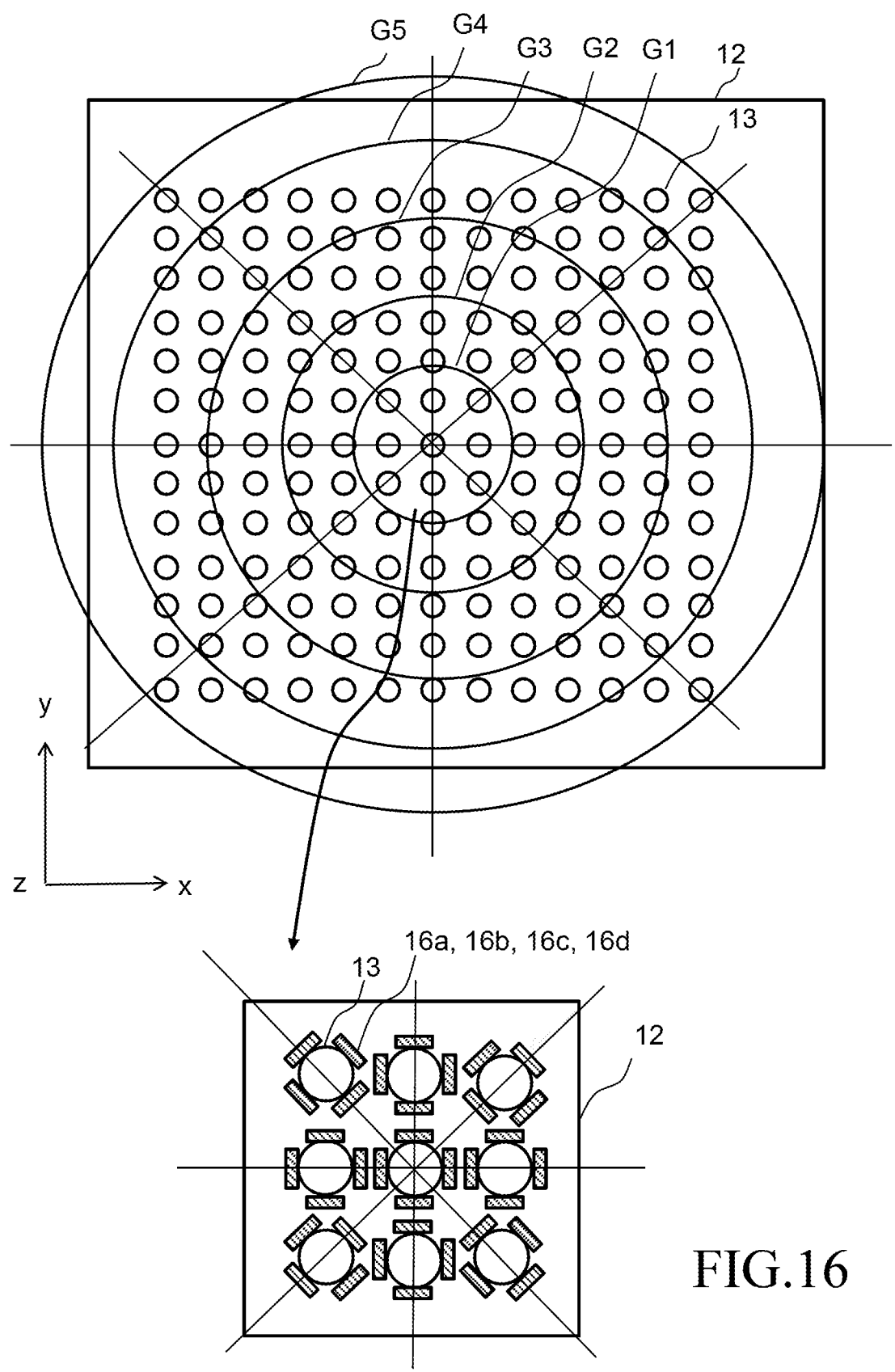
FIG. 16 illustrates grouping of electrode sets, and arrangement of electrodes according to a modified example of the second embodiment.

FIG. 16 illustrates grouping of electrode sets, and arrangement of electrodes according to a modified example of the second embodiment. In the case of FIG. 16, similarly to FIG. 15, 13×13 multiple beams are used. In FIG. 16, 13×13 passage holes 13 corresponding to the arrangement number of the multiple beams are formed on the middle electrode substrate 12 of the aberration corrector 220. An electrode set composed of the electrodes 16*a*, 16*b*, 16*c*, and 16*d* of four or more poles (not shown) is arranged around each passage hole 13. In the case of FIG. 16, the arrangement direction of the electrodes 16*a*, 16*b*, 16*c*, and 16*d* around each passage hole 13 is rotated corresponding to the phase, centering on the center beam (optical axis). In other words, the arrangement direction of the electrodes 16*a*, 16*b*, 16*c*, and 16*d* around each passage hole 13 is let to be in the radial direction. By this, with respect to not only the bias potential but also the deflection potential, the deviation amount of astigmatism generated in each beam in the same group is around the same as each other, it is sufficient to perform astigmatism correction using the same correction amount. Thereby, in FIG. 16, the power supply circuit for applying the bias potential can be used in common in each group, and the power supply circuit for applying the deflection potential for correcting astigmatism can also be used in common in each group. In other words, the number of the power supply circuits for applying the deflection potential for correcting astigmatism can be reduced to the number of the groups.

As described above, in the second embodiment, by performing grouping according to the concentric circle, the power supply circuit for applying a potential to the electrode 16 of the middle electrode substrate 12 of the aberration corrector 220 can be used in common, thereby greatly reducing the number of power supply circuits.

In the above description, each " . . . circuit" includes a processing circuitry. As the processing circuitry, for example, an electric circuit, computer, processor, circuit board, quantum circuit, semiconductor device, or the like can be used. Each " . . . circuit" may use a common processing circuitry (same processing circuitry), or different processing circuitries (separate processing circuitries). A program for causing a processor to execute processing may be stored in a recording medium, such as a magnetic disk drive, magnetic tape drive, FD, ROM (Read Only Memory), etc. For example, the position circuit 107, the comparison circuit 108, the reference image generation circuit 112, the correction data generation circuit 130, etc. may be configured by at least one processing circuitry described above.

Embodiments have been explained referring to specific examples described above. However, the present invention is not limited to these specific examples.

While the apparatus configuration, control method, and the like not directly necessary for explaining the present invention are not described, some or all of them can be selectively used on a case-by-case basis when needed.

In addition, any other multiple electron beam irradiation apparatus, multiple electron beam inspection apparatus, and multiple electron beam irradiation method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple electron beam irradiation apparatus comprising:
    an electromagnetic lens configured to refract multiple electron beams incident;
    an aberration corrector arranged in a magnetic field of the electromagnetic lens, and configured to be able to individually apply a bias potential and a deflection potential to each of the multiple electron beams; and
    an objective lens configured to focus the multiple electron beams, a trajectory of the each of which has been individually corrected by the bias potential and the deflection potential, onto a target object.

2. The apparatus according to claim 1, wherein the aberration corrector includes
    a plurality of substrates in each of which a plurality of passage holes for letting the multiple electron beams pass therethrough are formed, and
    a plurality of electrode sets, each of which is composed of electrodes of at least four poles and is arranged to surround each of the plurality of passage holes, formed on a middle substrate of the plurality of substrates.

3. The apparatus according to claim 2, wherein the aberration corrector individually corrects astigmatism of a corresponding beam by using the electrodes of at least four poles, with respect to each of the plurality of electrode sets.

4. The apparatus according to claim 2, wherein the aberration corrector individually corrects distortion of a corresponding beam from a design position on the target object by using the electrodes of at least four poles, with respect to each of the plurality of electrode sets.

5. The apparatus according to claim 2, wherein a ground potential is applied to an upper substrate and a lower substrate of the plurality of substrates.

6. The apparatus according to claim 1, wherein the aberration corrector corrects a beam diameter of a center beam and each of those of other beams in the multiple electron beams to be same as each other on the target object.

7. The apparatus according to claim 1, wherein the aberration corrector individually corrects a focus position of each of the multiple electron beams.

8. A multiple electron beam inspection apparatus comprising:
    an electromagnetic lens configured to refract multiple primary electron beams incident;
    an aberration corrector arranged in a magnetic field of the electromagnetic lens, and configured to be able to individually apply a bias potential and a deflection potential to each of the multiple primary electron beams;
    an objective lens configured to focus the multiple primary electron beams, a trajectory of the each of which has been individually corrected by the bias potential and the deflection potential, onto a target object; and a detector configured to detect multiple secondary electron beams emitted due to irradiation of the multiple primary electron beams onto the target object.

9. The apparatus according to claim 8, further comprising:

a comparison circuit configured to compare, while treating an image of the multiple secondary electron beams having been detected as an inspection image, the inspection image and a reference image.

10. A multiple electron beam irradiation method comprising:

receiving multiple electron beams by an electromagnetic lens, and refracting them by it;

applying a bias potential and a deflection potential individually to each of the multiple electron beams by an aberration corrector arranged in a magnetic field of the electromagnetic lens; and focusing the multiple electron beams, a trajectory of the each of which has been individually corrected by the bias potential and the deflection potential, onto a target object by an objective lens.

\* \* \* \* \*